(12) United States Patent
Min

(10) Patent No.: US 11,437,431 B2
(45) Date of Patent: Sep. 6, 2022

(54) MEMORY DEVICE WITH FLAT-TOP BOTTOM ELECTRODES AND METHODS FOR FORMING THE SAME

(71) Applicant: Taiwan Semiconductor Manufacturing Company Limited, Hsinchu (TW)

(72) Inventor: Chung-Chiang Min, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 108 days.

(21) Appl. No.: 16/743,319

(22) Filed: Jan. 15, 2020

(65) Prior Publication Data

US 2021/0217811 A1 Jul. 15, 2021

(51) Int. Cl.
*H01L 43/02* (2006.01)
*H01L 27/22* (2006.01)
(Continued)

(52) U.S. Cl.
CPC .......... *H01L 27/222* (2013.01); *G11C 11/161* (2013.01); *H01L 43/02* (2013.01); *H01L 43/12* (2013.01)

(58) Field of Classification Search
CPC ....... H01L 27/222; H01L 43/02; H01L 43/12; G11C 11/161
(Continued)

(56) References Cited

U.S. PATENT DOCUMENTS

2013/0026585 A1* 1/2013 Sung .............. H01L 43/08 257/421
2017/0229646 A1 8/2017 Chou et al.
(Continued)

FOREIGN PATENT DOCUMENTS

DE 10124366 A1 11/2002
DE 102019113416 A1 4/2020
(Continued)

OTHER PUBLICATIONS

Taiwan Patent Office: Application No. 109109372; Office Action dated Mar. 31, 2021.
(Continued)

*Primary Examiner* — Jami Valentine Miller
(74) *Attorney, Agent, or Firm* — The Marbury Law Group, PLLC

(57) ABSTRACT

A memory device includes an array of memory cells overlying a substrate and located in a memory array region. Each of the memory cells includes a bottom electrode, a vertical stack containing a memory element and a top electrode, and dielectric sidewall spacers located on sidewalls of each vertical stack. The bottom electrode comprises a flat-top portion that extends horizontally beyond an outer periphery of the dielectric sidewall spacers. The device also includes a discrete etch stop dielectric layer over each of the memory cells that includes a horizontally-extending portion that extends over the flat-top portion of the bottom electrode. The device also includes metallic cell contact structures that contact a respective subset of the top electrodes and a respective subset of vertically-protruding portions of the discrete etch stop dielectric layer.

20 Claims, 22 Drawing Sheets

(51) Int. Cl.
  *G11C 11/16*      (2006.01)
  *H01L 43/12*      (2006.01)
(58) Field of Classification Search
  USPC ......................................................... 257/421
  See application file for complete search history.

(56) References Cited

U.S. PATENT DOCUMENTS

| | | | |
|---|---|---|---|
| 2017/0236896 A1* | 8/2017 | Lu | H01L 27/11582 257/314 |
| 2018/0097177 A1 | 4/2018 | Chang et al. | |
| 2018/0366638 A1 | 12/2018 | Lin et al. | |
| 2019/0267391 A1* | 8/2019 | Imai | H01L 27/11556 |
| 2019/0280001 A1* | 9/2019 | Terasawa | H01L 27/11556 |
| 2021/0313454 A1* | 10/2021 | Shen | H01L 29/785 |
| 2021/0391342 A1* | 12/2021 | Chang | H01L 23/5252 |

FOREIGN PATENT DOCUMENTS

| | | |
|---|---|---|
| KR | 20140067116 A | 6/2014 |
| KR | 20160138387 A | 12/2016 |
| KR | 20190059214 A | 5/2019 |
| KR | 20190135903 A | 12/2019 |
| WO | 2013/040072 A1 | 3/2013 |
| WO | 2015/147855 A1 | 10/2015 |

OTHER PUBLICATIONS

Korean Patent Office: Application No. 1020200045407; Office Action dated Sep. 20, 2021, 6 pages.
German Patent and Trademark Office, Application No. 102020101351.9 Examination Report dated Jun. 23, 2020, 3 pages.

* cited by examiner

MEMORY DEVICE WITH FLAT-TOP BOTTOM ELECTRODES AND METHODS FOR FORMING THE SAME

BACKGROUND

The present disclosure is directed to semiconductor devices, and specifically to a semiconductor memory device using an etch stop hard mask layer for contact via structures and methods of forming the same.

Semiconductor memory devices are widely used in modern electronic devices. Some semiconductor memory devices employ memory cells that include a respective a bottom electrode and vertical stack including a memory element and a top electrode. For example, a magnetic tunnel junction memory device can employ such a vertical stack in which the memory element includes a magnetic tunnel junction. Electrical contact to the top electrodes can be provided employing contact via structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
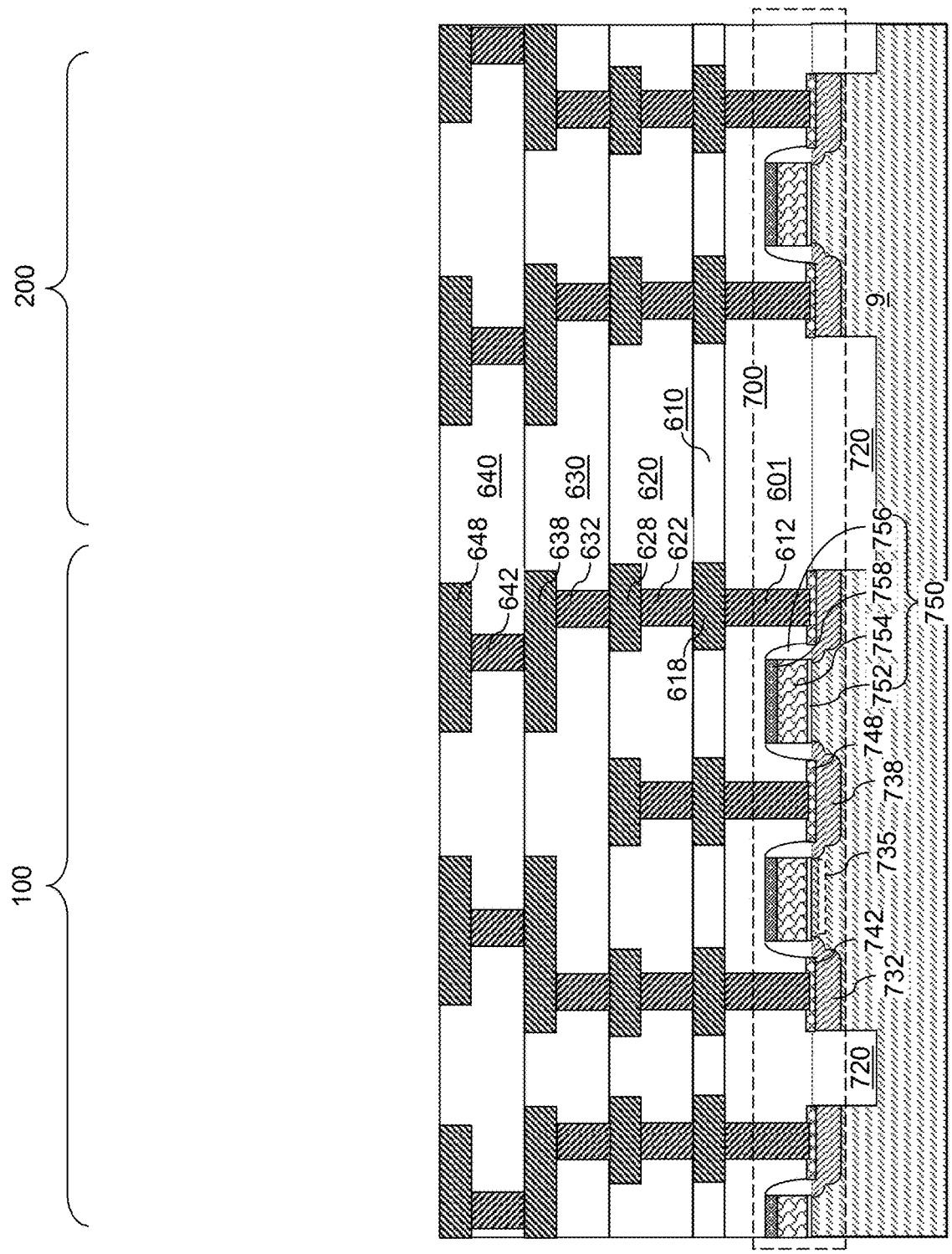
FIG. 1 is a vertical cross-sectional view of an exemplary structure after formation of complementary metal-oxide-semiconductor (CMOS) transistors and metal interconnect structures formed in dielectric material layers according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure can be used for memory devices including an array of memory cells overlying a substrate and located in a memory array region and a logic region located outside the memory array region and is free of memory cells. Each of the memory cells can include a bottom electrode and a vertical stack containing a memory element and a top electrode. The vertical stacks can be arranged as a one-dimensional array or as a two-dimensional array at a high density that is sufficient to provide topographic average height difference for a dielectric matrix layer to be subsequently formed. However, increasing the density of memory cells introduces additional fabrication concerns. As the lateral dimensions of the memory cells shrink, the process window for formation of contact via structures shrinks. Cutting the bottom electrode layer and the electrode connection via structure layer to form the bottom electrodes and bottom electrode connection via structures may result in undesired reduction of the thickness of the top electrode of the memory cells. For example, the top electrode may be reduced in thickness by 200 Å-300 Å.

An etch stop dielectric layer may be formed over the memory cells in the memory array region prior to cutting the bottom electrode layer and the electrode connection via structure layer. A photoresist may then be formed over the etch stop dielectric layer. The photoresist may be patterned such that the bottom electrode layer and the electrode connection via structure layer can be cut while the photoresist and the etch stop layer protect the top electrodes of the memory cells. In this manner, the thickness of the top electrode can be preserved while forming the bottom electrode. While the present disclosure is described using an embodiment in which each memory element includes a magnetic tunnel junction providing magnetoresistance, embodiments are expressly contemplated herein in which the magnetic tunnel junction is replaced with any layer or any layer stack that can provide at least two different states of resistance between the bottom electrode and the top electrode. Therefore, claims of the present disclosure are to be construed to encompass all such variations unless otherwise limited to magnetoresistive memory devices including a respective magnetic tunnel junction.

Further, it is to be understood that the memory devices according to embodiments of the present disclosure may comprise a single discrete memory cell, a one-dimensional array of memory cells, or a two-dimensional array of memory cells. It is also to be understood that a one-dimensional array of memory cells of the present disclosure may be implemented as a periodic one-dimensional array of memory cells, and a two-dimensional array of memory cells of the present disclosure may be implemented as a periodic two-dimensional array of memory cells. In addition, while present disclosure is described using an embodiment in which a two-dimensional array of memory cells is formed within fifth metal interconnect levels, which are commonly referred to as a fifth line-and-via (M5+V4) level, embodiments are expressly contemplated herein in which the two-dimensional array of memory cells is formed within different metal interconnect levels.

Referring to FIG. 1, an exemplary structure according to an embodiment of the present disclosure is illustrated. The exemplary structure includes a substrate 9, which can be a semiconductor substrate such as a commercially available silicon substrate. Shallow trench isolation structures 720 including a dielectric material such as silicon oxide can be formed in an upper portion of the substrate 9. Suitable doped semiconductor wells, such as p-type wells and n-type wells, can be formed within each area that is laterally enclosed by a continuous portion of the shallow trench isolation structures 720. Field effect transistors 700 may be formed over the top surface of the substrate 9. For example, each field effect transistor can include a source region 732, a drain region 738, a semiconductor channel 735 that includes a surface portion of the substrate 9 extending between the source region 732 and the drain region 738, and a gate structure 750. Each gate structure 750 can include a gate dielectric 752, a gate electrode 754, a gate cap dielectric 758, and a dielectric gate spacer 756. A source-side metal-semiconductor alloy region 742 can be formed on each source region 732, and a drain-side metal-semiconductor alloy region 748 can be formed on each drain region 738.

The exemplary structure can include a memory array region 100 in which an array of memory elements may be subsequently formed, and a logic region 200 in which logic devices that support operation of the array of memory elements may be formed. In one embodiment, devices (such as field effect transistors) in the memory array region 100 can include bottom electrode access transistors that provide access to bottom electrodes of memory cells to be subsequently formed. Top electrode access transistors that provide access to top electrodes of memory cells to be subsequently formed may be formed in the logic region 200 at this processing step. Devices (such as field effect transistors) in the logic region 200 can provide functions that are needed to operate the array of memory cells to be subsequently formed. Specifically, devices in the logic region 200 may be configured to control the programming operation, the erase operation, and the sensing (read) operation of the array of memory cells. For example, the devices in the logic region 200 may include a sensing circuitry and/or a top electrode bias circuitry. The devices formed on the top surface of the substrate 9 may include complementary metal-oxide-semiconductor (CMOS) transistors and optionally additional semiconductor devices (such as resistors, diodes, capacitors, etc.), and are collectively referred to as CMOS circuitry 700.

Various metal interconnect structures formed in dielectric material layers can be subsequently formed over the substrate 9 and the devices (such as field effect transistors). The dielectric material layers can include, for example, a contact-level dielectric material layer 601, a first metal-line-level dielectric material layer 610, a second line-and-via-level dielectric material layer 620, a third line-and-via-level dielectric material layer 630, and a fourth line-and-via-level dielectric material layer 640. The metal interconnect structures can include device contact via structures 612 formed in the contact-level dielectric material layer 601 and contact a respective component of the CMOS circuitry 700, first metal line structures 618 formed in the first metal-line-level dielectric material layer 610, first metal via structures 622 formed in a lower portion of the second line-and-via-level dielectric material layer 620, second metal line structures 628 formed in an upper portion of the second line-and-via-level dielectric material layer 620, second metal via structures 632 formed in a lower portion of the third line-and-via-level dielectric material layer 630, third metal line structures 638 formed in an upper portion of the third line-and-via-level dielectric material layer 630, third metal via structures 642 formed in a lower portion of the fourth line-and-via-level dielectric material layer 640, and fourth metal line structures 648 formed in an upper portion of the fourth line-and-via-level dielectric material layer 640. In one embodiment, the second metal line structures 628 can include source lines that are connected a source-side power supply for an array of memory elements. The voltage provided by the source lines can be applied to the bottom electrodes through the access transistors provided in the memory array region 100.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Other suitable materials within the contemplated scope of disclosure may also be used. Each of the metal interconnect structures (612, 618, 622, 628, 632, 638, 642, 648) may include at least one conductive material, which can be a combination of a metallic liner layer (such as a metallic nitride or a metallic carbide) and a metallic fill material. Each metallic liner layer can include TiN, TaN, WN, TiC, TaC, and WC, and each metallic fill material portion can include W, Cu, Al, Co, Ru, Mo, Ta, Ti, alloys thereof, and/or combinations thereof. Other suitable materials within the contemplated scope of disclosure may also be used. In one embodiment, the first metal via structures 622 and the second metal line structures 628 can be formed as integrated line and via structures by a dual damascene process, the second metal via structures 632 and the third metal line structures 638 can be formed as integrated line and via structures by a dual damascene process, and/or the third metal via structures 642 and the fourth metal line structures 648 can be formed as integrated line and via structures by a dual damascene process. While the present disclosure is described using an embodiment in which an array of memory cells formed over the fourth line-and-via-level dielectric material layer 640, embodiments are expressly contemplated herein in which the array of memory cells may be formed at a different metal interconnect level.

Figure 2:
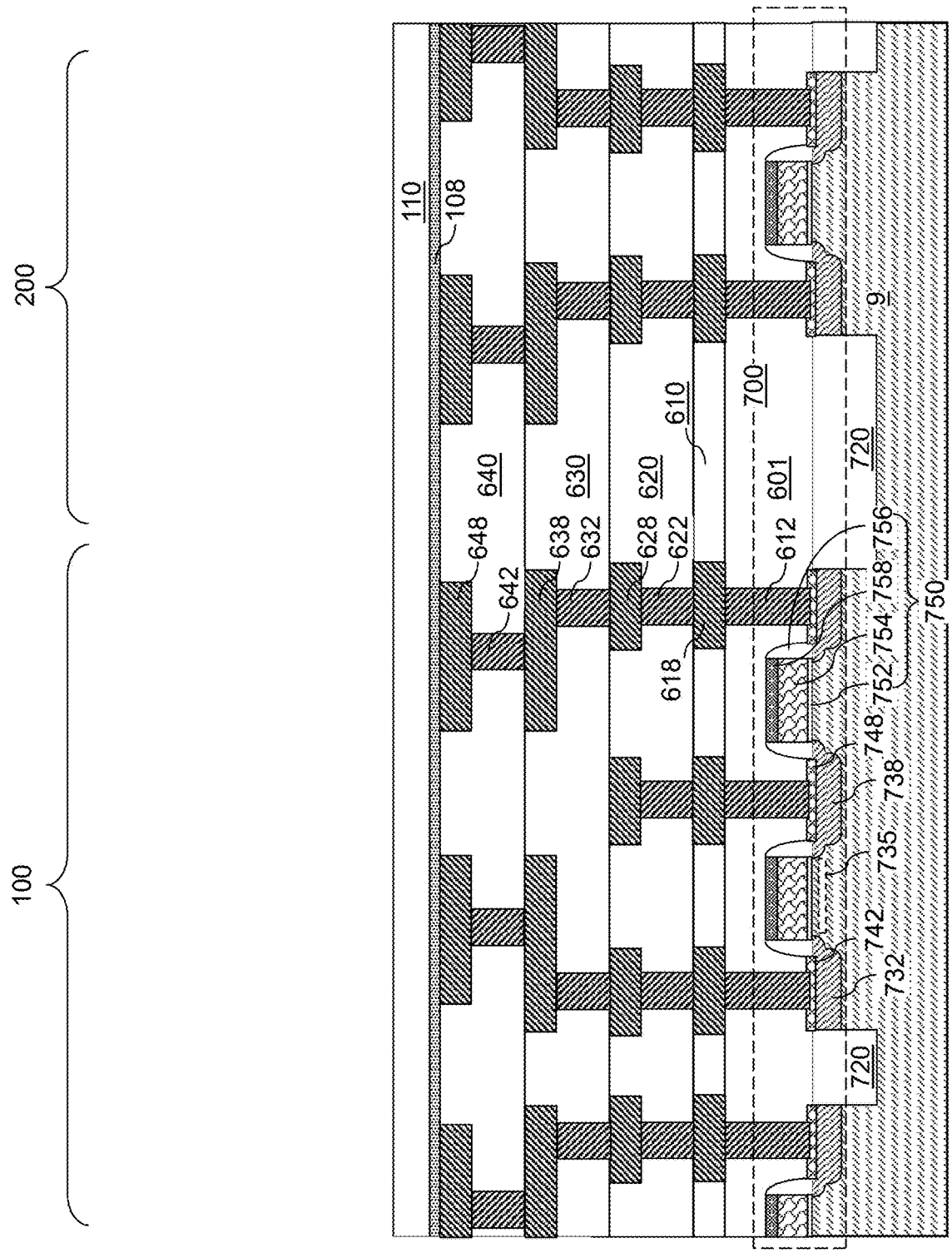
FIG. 2 is a vertical cross-sectional view of the exemplary structure after formation of a dielectric cap layer and a via-level dielectric layer according to an embodiment of the present disclosure.

Referring to FIG. 2, a dielectric cap layer 108 and a via-level dielectric layer 110 can be sequentially formed over the metal interconnect structures and the dielectric material layers. For example, the dielectric cap layer 108 can be formed on the top surfaces of the fourth metal line structures 648 and on the top surface of the fourth line-and-via-level dielectric material layer 640. The dielectric cap layer 108 includes a dielectric capping material that can protect underlying metal interconnect structures such as the fourth metal line structures 648. In one embodiment, the dielectric cap layer 108 can include a material that can provide high etch resistance, i.e., a dielectric material and also may function as an etch stop material during a subsequent anisotropic etch process that etches the via-level dielectric layer 110. For example, the dielectric cap layer 108 can include silicon carbide or silicon nitride, and can have a thickness in a range from 5 nm to 30 nm, although lesser and greater thicknesses can also be used.

The via-level dielectric layer 110 can include any material that may be used for the dielectric material layers (601, 610, 620, 630, 640). For example, the via-level dielectric layer 110 can include undoped silicate glass or a doped silicate glass deposited by decomposition of tetraethylorthosilicate (TEOS). The thickness of the via-level dielectric layer 110 can be in a range from 50 nm to 200 nm, although lesser and greater thicknesses can also be used. The dielectric cap layer 108 and the via-level dielectric layer 110 can be formed as planar blanket (unpatterned) layers having a respective planar top surface and a respective planar bottom surface that extends throughout the memory array region 100 and the logic region 200.

Figure 3:
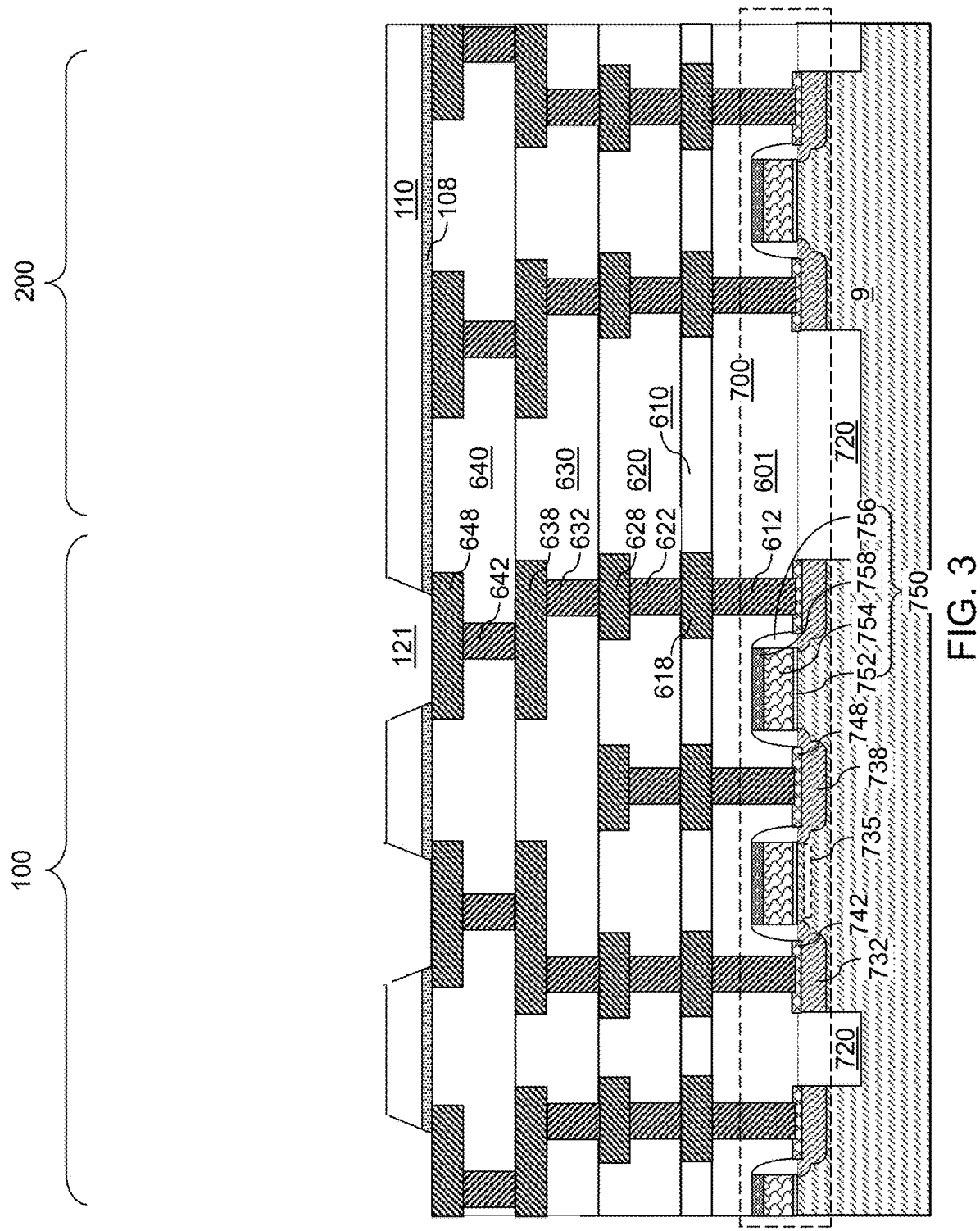
FIG. 3 is a vertical cross-sectional view of the exemplary structure after formation of lower-electrode-contact via cavities according to an embodiment of the present disclosure.

Referring to FIG. 3, via cavities may be formed through the via-level dielectric layer 110 and the dielectric cap layer 108. For example, a photoresist layer (not shown) can be applied over the via-level dielectric layer 110 and can be patterned to form opening within areas of the memory array region 100 that overlie a respective one of the fourth metal line structures 648. An anisotropic etch can be performed to transfer the pattern in the photoresist layer through the through the via-level dielectric layer 110 and the dielectric cap layer 108. The via cavities formed by the anisotropic etch process are herein referred to as lower-electrode-contact via cavities 121 because bottom electrode connection via structures are subsequently formed in the lower-electrode-contact via cavities 121. The lower-electrode-contact via cavities 121 can have tapered sidewalls having a taper angle (within respective to a vertical direction) in a range from 1 degree to 10 degrees. A top surface of a fourth metal line structure 648 can be physically exposed at the bottom of each lower-electrode-contact via cavity 121. The photoresist layer can be subsequently removed, for example, by ashing.

Figure 4:
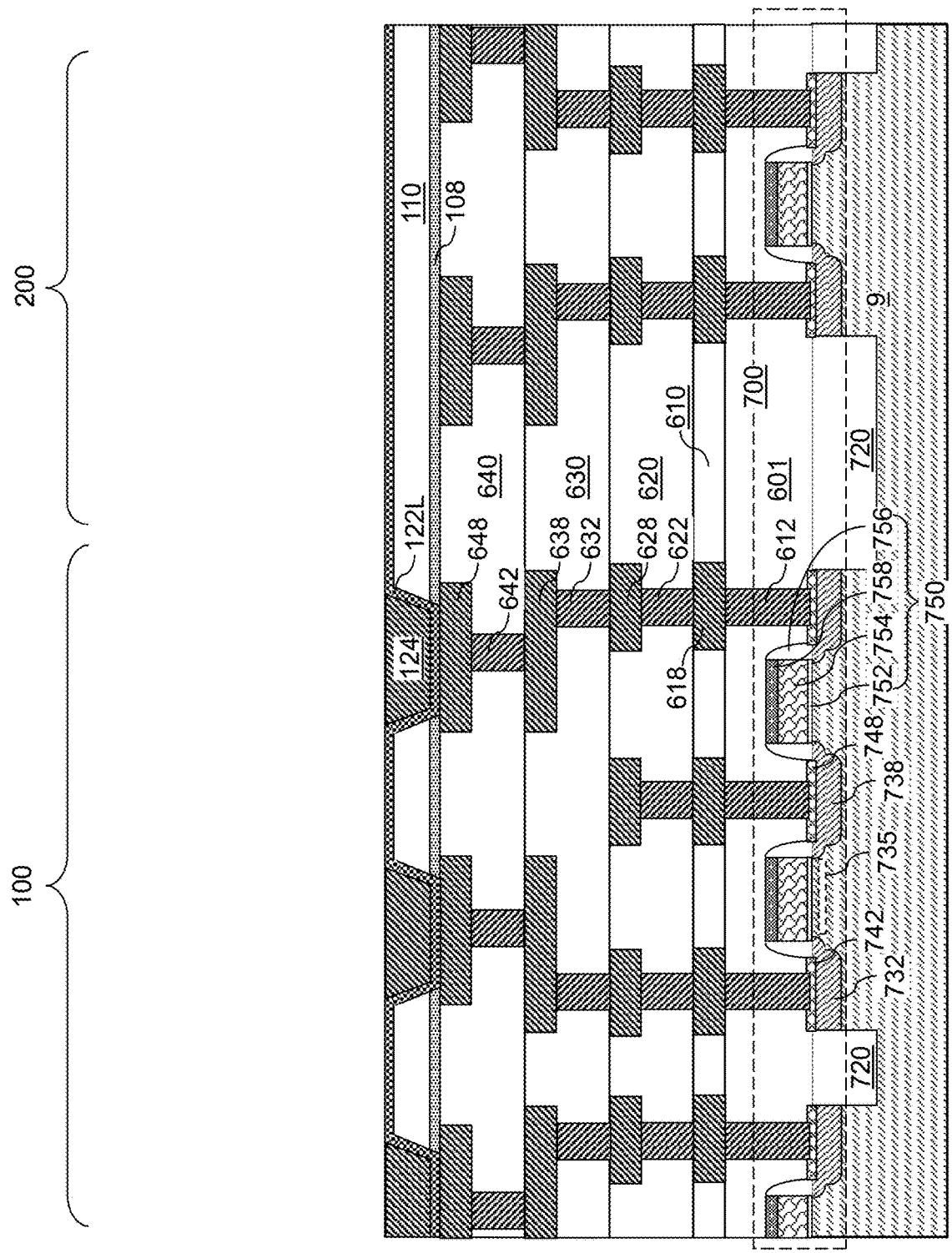
FIG. 4 is a vertical cross-sectional view of the exemplary structure after formation of a continuous metallic barrier layer and metallic via fill material portions according to an embodiment of the present disclosure.

Referring to FIG. 4, a continuous metallic barrier layer 122L can be formed as a continuous material layer. The continuous metallic barrier layer 122L may cover physically exposed top surfaces of the fourth metal line structures 648, tapered sidewalls of the lower-electrode-contact via cavities 121, and the top surface of the via-level dielectric layer 110 without any hole therethrough. The continuous metallic barrier layer 122L can include a conductive metallic nitride such as TiN, TaN, and/or WN. Other suitable materials within the contemplated scope of disclosure may also be used. The thickness of the continuous metallic barrier layer 122L can be in a range from 3 nm to 20 nm, although lesser and greater thicknesses can also be used.

A metallic fill material such as tungsten or copper can be deposited in remaining volumes of the lower-electrode-contact via cavities 121. Other suitable materials within the contemplated scope of disclosure may also be used. Portions of the metallic fill material that overlie the horizontal plane including the topmost surface of the continuous metallic barrier layer 122L can be removed by a planarization process such as chemical mechanical planarization to form metallic via fill material portions 124. Each metallic via fill material portion 124 can have a top surface that is coplanar with the topmost surface of the continuous metallic barrier layer 122L.

Figure 5:
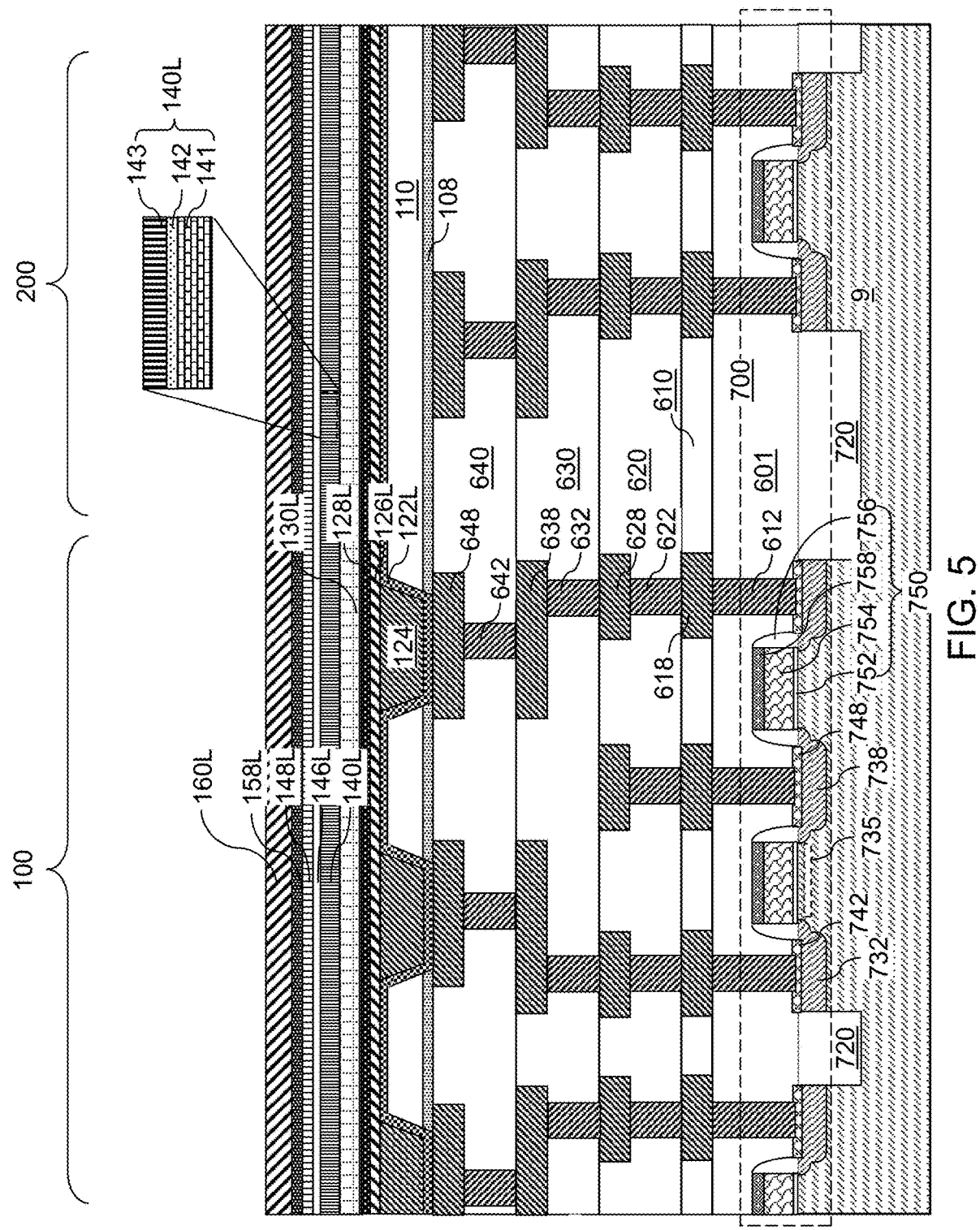
FIG. 5 is a vertical cross-sectional view of the exemplary structure after formation of a continuous first bottom electrode material layer, a continuous second bottom electrode material layer, a continuous selector material layer, a continuous synthetic antiferromagnet layer, a continuous nonmagnetic tunnel barrier layer, a continuous free magnetization layer, at least one continuous capping layer, and a continuous top electrode material layer according to an embodiment of the present disclosure.

Referring to FIG. 5, a layer stack including a continuous first bottom electrode material layer 126L, a continuous second bottom electrode layer 128L, an optional continuous selector material layer 130L, a continuous synthetic antiferromagnet layer 140L, a continuous nonmagnetic tunnel barrier layer 146L, a continuous free magnetization layer 148L, at least one continuous capping layer 158L, and a continuous top electrode material layer 160L can be formed over the continuous metallic barrier layer 122L and the metallic via fill material portions 124. The layers within the layer stack can be deposited by a respective chemical vapor deposition process or a respective physical vapor deposition process. Each layer within the layer stack can be deposited as planar blanket material layers having a respective uniform thickness throughout. In an embodiment, optional continuous selector material layer 130L may be omitted.

The continuous first bottom electrode material layer 126L includes at least one metallic material such as TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the continuous first bottom electrode material layer 126L can include, and/or can consist essentially of, tungsten (W). The thickness of the continuous first bottom electrode material layer 126L can be in a range from 10 nm to 100 nm, although lesser and greater thicknesses can also be used.

The continuous second bottom electrode material layer 128L may comprise the same material as the continuous second bottom electrode material layer 126L or it may be a different material. In an embodiment, the continuous second bottom electrode material layer 128L may include a nonmagnetic material that may function as a seed layer. Specifically, the continuous second bottom electrode material layer 128L can provide a template crystalline structure that aligns polycrystalline grains of the materials of the continuous synthetic antiferromagnet layer 140L along directions that maximizes the magnetization of a reference layer within the continuous synthetic antiferromagnet layer 140L. The thickness of the continuous second bottom electrode material layer 128L can be in a range from 3 nm to 20 nm, although lesser and greater thicknesses can also be used. The total thickness of the first and second bottom electrode material layers 126L, 128L may be in the range of 100-200 Å.

The continuous selector material layer 130L includes a selector material, i.e., a material that exhibits a voltage-dependent switch characteristic. The continuous selector material layer 130L can include an oxygen-vacancy-modulated selector material such as hafnium oxide or zirconium oxide, an ovonic threshold switch material such as zinc telluride, or a vertical diode layer stack including a p-doped semiconductor layer and an n-doped semiconductor layer with a horizontal p-n junction therebetween. Other suitable materials within the contemplated scope of disclosure may also be used. Alternatively, other materials that turn on under a high voltage bias and turns off under a low voltage bias may be used for the continuous selector material layer 130L.

The continuous synthetic antiferromagnet (SAF) layer 140L can include a layer stack of a ferromagnetic hard layer 141, an antiferromagnetic coupling layer 142, and a reference magnetization layer 143. Each of the ferromagnetic hard layer 141 and the reference magnetization layer 143 can have a respective fixed magnetization direction. The antiferromagnetic coupling layer 142 provides antiferromagnetic coupling between the magnetization of the ferromagnetic hard layer 141 and the magnetization of the reference magnetization layer 143 so that the magnetization direction of the ferromagnetic hard layer 141 and the magnetization direction of the reference magnetization layer 143 remain fixed during operation of the memory cells to be subsequently formed. The ferromagnetic hard layer 141 can include a hard ferromagnetic material such as PtMn, IrMn, RhMn, FeMn, OsMn, etc. The reference magnetization layer 143 can include a hard ferromagnetic material such as Co, CoFe, CoFeB, CoFeTa, NiFe, CoPt, CoFeNi, etc. Other suitable materials within the contemplated scope of disclosure may also be used. The antiferromagnetic coupling layer 142 can include ruthenium or iridium. The thickness of the antiferromagnetic coupling layer 142 can be selected such that the exchange interaction induced by the antiferromagnetic coupling layer 142 stabilizes the relative magnetization directions of the ferromagnetic hard layer 141 and the reference magnetization layer 143 at opposite directions, i.e., in an antiparallel alignment. In one embodiment, the net magnetization of the continuous SAF layer 140L by matching the magnitude of the magnetization of the ferromagnetic hard layer 141 with the magnitude of the magnetization of the reference magnetization layer 143. The thickness of the continuous SAF layer 140L can be in a range from 5 nm to 30 nm, although lesser and greater thicknesses can also be used.

The continuous nonmagnetic tunnel barrier layer 146L can include a tunneling barrier material, which may be an electrically insulating material having a thickness that allows electron tunneling. For example, the continuous nonmagnetic tunnel barrier layer 146L can include magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). Other suitable materials within the contemplated scope of disclosure may also be used. The thickness of the continuous nonmagnetic tunnel barrier layer 146L can be 0.7 nm to 1.3 nm, although lesser and greater thicknesses can also be used.

The continuous free magnetization layer 148L includes a ferromagnetic material having two stable magnetization directions that are parallel or antiparallel to the magnetization direction of the reference magnetization layer 143. The continuous free magnetization layer 148L includes a hard ferromagnetic material such as Co, CoFe, CoFeB, CoFeTa, NiFe, CoPt, CoFeNi, etc. Other suitable materials within the contemplated scope of disclosure may also be used. The thickness of the continuous free magnetization layer 148L may be in a range from 1 nm to 6 nm, although lesser and greater thicknesses can also be used.

The at least one continuous capping layer 158L includes at least one capping material. Exemplary capping materials that may be used for the at least one continuous capping layer 158L include, but are not limited to, a metallic material such as Be, Mg, Al, Ti, Ta, W, Ge, Pt, Ru, Cu, an alloy thereof, and a layer stack thereof. Other suitable materials within the contemplated scope of disclosure may also be used. Additionally, or alternatively, the at least one continuous capping layer 158L may include a conductive metal nitride and/or a conductive metal nitride. The total thickness of the at least one continuous capping layer 158L can be in a range from 0.5 nm to 5 nm, although lesser and greater thicknesses can also be used.

The continuous top electrode material layer 160L includes at least one metallic material such as TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the continuous top electrode material layer 160L can include, and/or can consist essentially of, tungsten (W). The thickness of the continuous top electrode material layer 160L can be in a range from 10 nm to 100 nm, although lesser and greater thicknesses can also be used.

Figure 6:
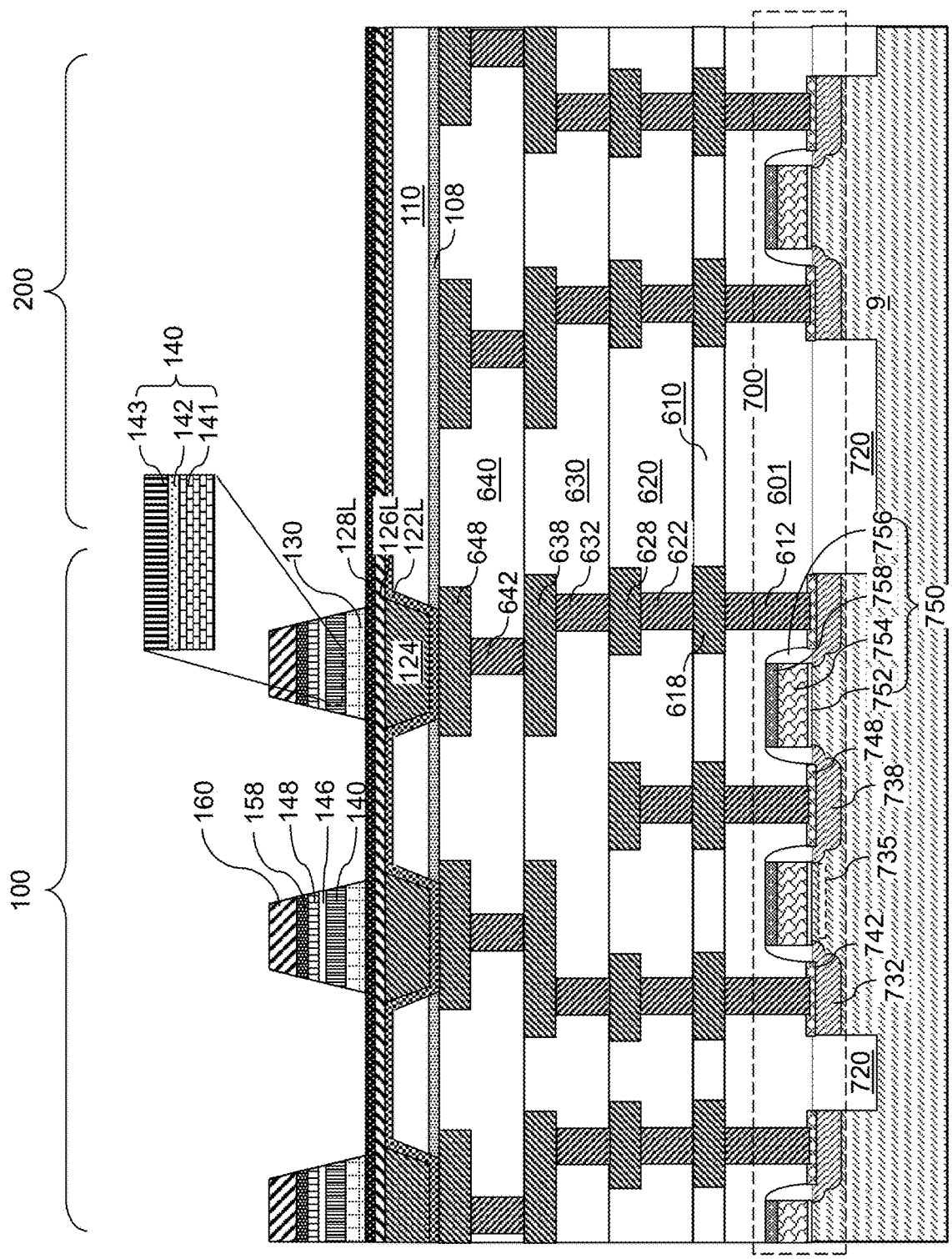
FIG. 6 is a vertical cross-sectional view of the exemplary structure after formation of an array of discrete vertical stacks, each including a selector element, a synthetic antiferromagnet structure, a nonmagnetic tunnel barrier layer, a free magnetization layer, at least one capping layer, and a top electrode according to an embodiment of the present disclosure.

Referring to FIG. 6, a photoresist layer (not shown) may be applied over the continuous top electrode material layer 160L, and can be lithographically patterned to form an array of discrete photoresist material portions. Each discrete photoresist material portion in the array of discrete photoresist material portions can overlie a respective one of the metallic via fill material portion 124. In one embodiment, the metallic via fill material portion 124 can be arranged as a two-dimensional periodic array having a first pitch along a first horizontal direction and a second pitch along a second horizontal direction. The discrete photoresist material portions can be arranged as a two-dimensional periodic array having the same periodicity as the two-dimensional periodic array of metallic via fill material portions 124.

An anisotropic etch process can be performed to etch unmasked regions of the continuous top electrode material layer 160L, the at least one continuous capping layer 158L, the continuous free magnetization layer 148L, the continuous nonmagnetic tunnel barrier layer 146L, the continuous SAF layer 140L, and the continuous selector material layer 130L. The chemistry of the anisotropic etch process can be selected such that patterned portions of the continuous top electrode material layer 160L, the at least one continuous capping layer 158L, the continuous free magnetization layer 148L, the continuous nonmagnetic tunnel barrier layer 146L, the continuous SAF layer 140L, and the continuous selector material layer 130L have tapered sidewalls having a taper angle in a range from 1 degree to 20 degrees, such as from 3 degrees to 10 degrees, with respective to the vertical direction. In one embodiment, the continuous second bottom electrode layer 128L may be used as an etch stop layer for the anisotropic etch process.

The patterned portions of the continuous top electrode material layer 160L, the at least one continuous capping layer 158L, the continuous free magnetization layer 148L, the continuous nonmagnetic tunnel barrier layer 146L, the continuous SAF layer 140L, and the continuous selector material layer 130L can constitute an array of discrete vertical stacks. Each discrete vertical stack can include, from bottom to top, a selector element 130, a synthetic antiferromagnet (SAF) structure 140, a nonmagnetic tunnel barrier layer 146, a free magnetization layer 148, at least one capping layer 158, and a top electrode 160. Each selector element 130 is a patterned portion of the continuous selector material layer 130L. Each SAF structure 140 is a patterned portion of the continuous SAF layer 140L. Each nonmagnetic tunnel barrier layer 146 may be a patterned portion of the continuous nonmagnetic tunnel barrier layer 146L. Each free magnetization layer 148 may be a patterned portion of the continuous free magnetization layer 148L. Each capping layer 158 may be a patterned portion of the at least one continuous capping layer 158L. Each top electrode 160 may be a patterned portion of the continuous top electrode material layer 160L.

The array of discrete vertical stacks (130, 140, 146, 148, 158, 160) may be formed over the substrate 9 in the memory array region 100. Each SAF structure 140 may include a layer stack of a ferromagnetic hard layer 141, an antiferromagnetic coupling layer 142, and a reference magnetization layer 143. A set of a reference magnetization layer 143, a nonmagnetic tunnel barrier layer 146, and a free magnetization layer 148 within a discrete vertical stack (130, 140, 146, 148, 158, 160) may constitute a magnetic tunnel junction (MTJ) that functions as a magnetoresistive memory element. The magnetization of the free magnetization layer 148 and the magnetization of the reference magnetization layer 143 within each discrete vertical stack (130, 140, 146, 148, 158, 160) may have two stable alignments, which include a parallel alignment and an antiparallel alignment. The bistable magnetic coupling between the ferromagnetic material of the free magnetization layer 148 and the ferromagnetic material of the reference magnetization layer 143 within each magnetic tunnel junction provides magnetoresistance, i.e., a change in the resistance between the free magnetization layer 148 and the reference magnetization layer 143 that is dependent on the alignment of the magnetization directions of the free magnetization layer 148 and the reference magnetization layer 143. Sidewalls of each element within each discrete vertical stack (130, 140, 146, 148, 158, 160) can be physically exposed after the anisotropic etch process. The photoresist layer can be subsequently removed, for example, by ashing.

While the present disclosure is described using an embodiment in which the continuous metallic barrier layer 122L, the continuous first bottom electrode material layer 126L and the continuous second bottom electrode layer 128L are not patterned at this processing step, embodiments are expressly contemplated herein in which the continuous metallic barrier layer 122L, the continuous first bottom electrode material layer 126L, and the continuous second bottom electrode layer 128L are patterned at this processing step.

Figure 7:
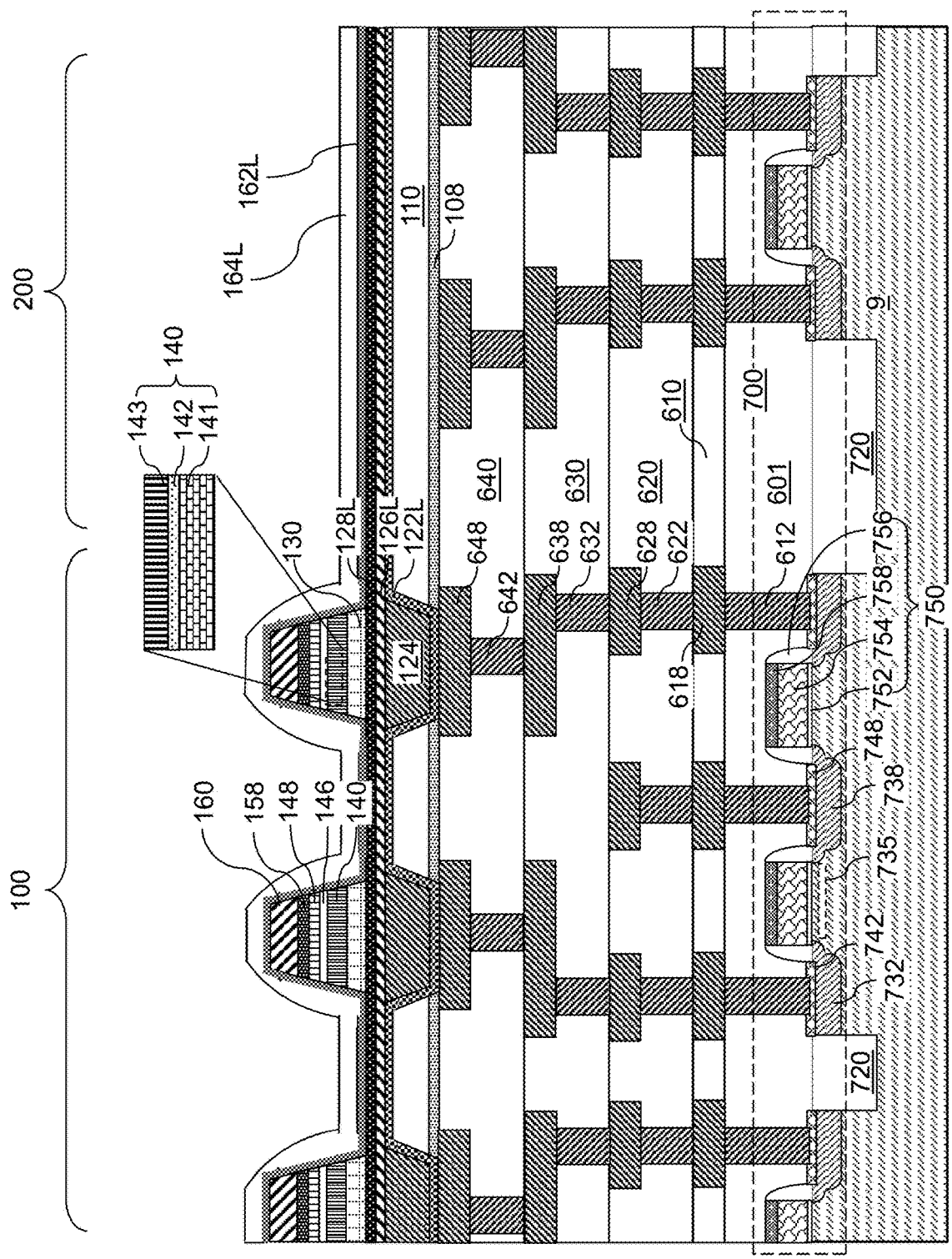
FIG. 7 is a vertical cross-sectional view of the exemplary structure after formation of an array of dielectric spacers around the according to an embodiment of the present disclosure.

Referring to FIG. 7, at least one continuous dielectric spacer material layer can be conformally deposited over the array of discrete vertical stacks (130, 140, 146, 148, 158, 160) and on the physically exposed portions of the top surface of the continuous second bottom electrode layer 128L. For example, a first dielectric spacer material layer 162L including a first dielectric spacer material and a second dielectric spacer material layer 164L including a second dielectric spacer material can be sequentially deposited using a respective conformal deposition process (such as a chemical vapor deposition process. For example, the first dielectric spacer material 162L can include silicon nitride or a dielectric metal oxide (such as aluminum oxide), and the second dielectric spacer material 164L can include silicon oxide (such as TEOS oxide). The thickness of the first dielectric spacer material layer 162L can be in a range from 3 nm to 10 nm, and the thickness of the second dielectric spacer material layer 164L can be in a range from 30 nm to 100 nm, although lesser and greater thicknesses can be used for each of the first dielectric spacer material 162L layer and the second dielectric spacer material layer 164L.

Figure 8:
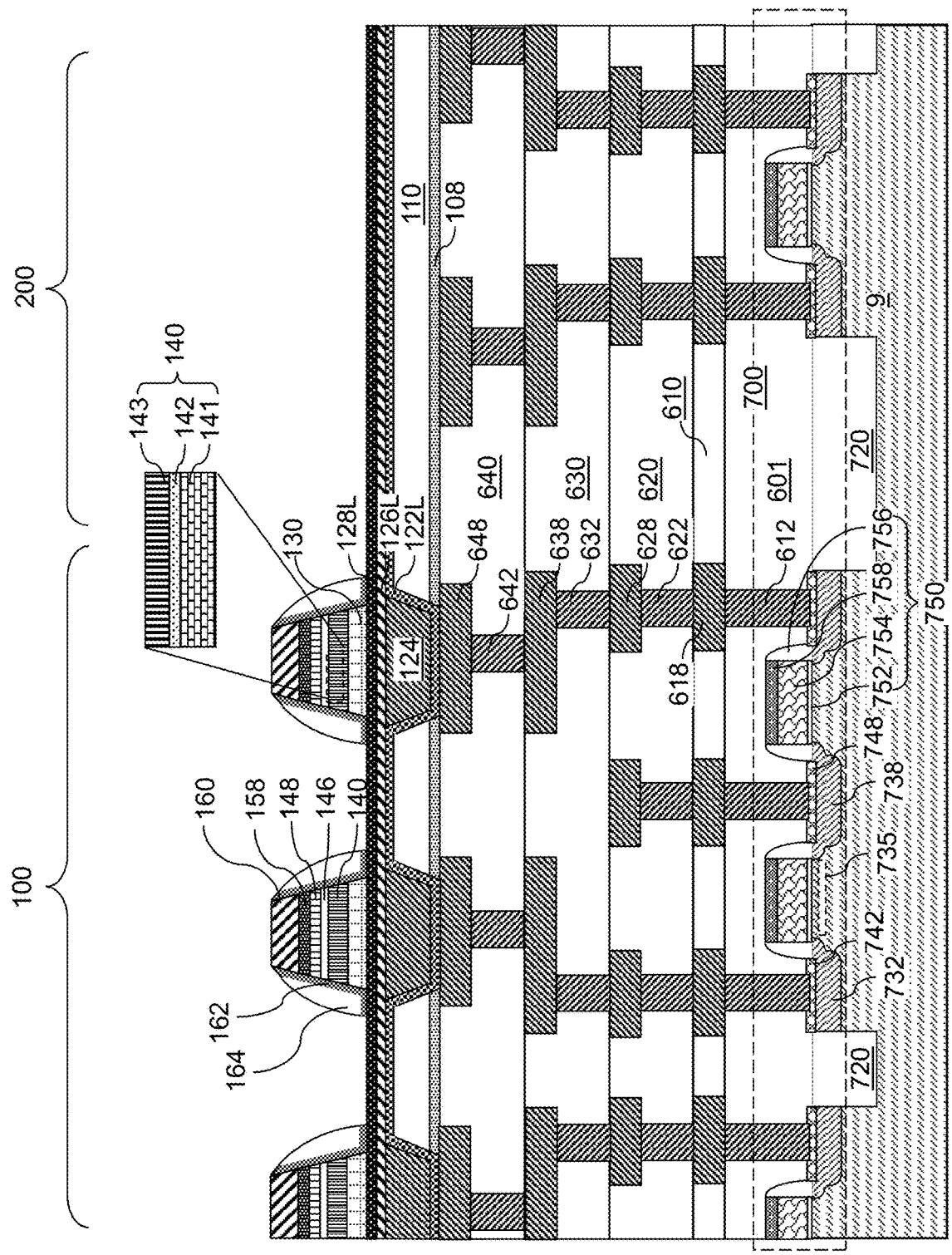
FIG. 8 is a vertical cross-sectional view of the exemplary structure after the array of dielectric spacers are etched.

Referring to FIG. 8, an anisotropic etch process can be performed to remove horizontal portions of the at least one dielectric spacer material layer (162L, 164L). The anisotropic etch process that etches the first dielectric spacer material 162 and the second dielectric spacer material 164 can be selective to the materials of the continuous second bottom electrode layer 128L and the top electrodes 160. Thus, the first dielectric sidewall spacer material 162 and the second dielectric sidewall spacer material 164 may act as an etch stop such that generally, an array of dielectric sidewall spacers (162, 164) can be formed around, and on, a respective discrete vertical stack (130, 140, 146, 148, 158, 160) in the array of discrete vertical stacks (130, 140, 146, 148, 158, 160). Each remaining portion of the first dielectric spacer material layer constitutes a first dielectric sidewall spacer 162, and each remaining portion of the second dielectric spacer material layer constitutes a second dielectric sidewall spacer 164. In one embodiment, each discrete vertical stack (130, 140, 146, 148, 158, 160) can be laterally surrounded by a first dielectric sidewall spacer 162 and a second dielectric sidewall spacer 164 to form sidewall spacers. In another embodiment, the first dielectric spacers 162 may be omitted. In such embodiments, each discrete vertical stack (130, 140, 146, 148, 158, 160) may be laterally surrounded by a single dielectric spacer, i.e., a second dielectric sidewall spacer 164. In this manner the thickness of the top electrode 160 may be preserved as the etch process may stop when the first dielectric sidewall spacer material 162 and the second dielectric sidewall spacer material 164 acting as an etch stop layer is reached. That is, the thickness of the top electrode 160 in a finished device is substantially the same as the thickness of the top electrode layer 160 deposited during fabrication of the memory device, such as within 1-5% of the thickness of the top electrode 160 layer.

Figure 9:
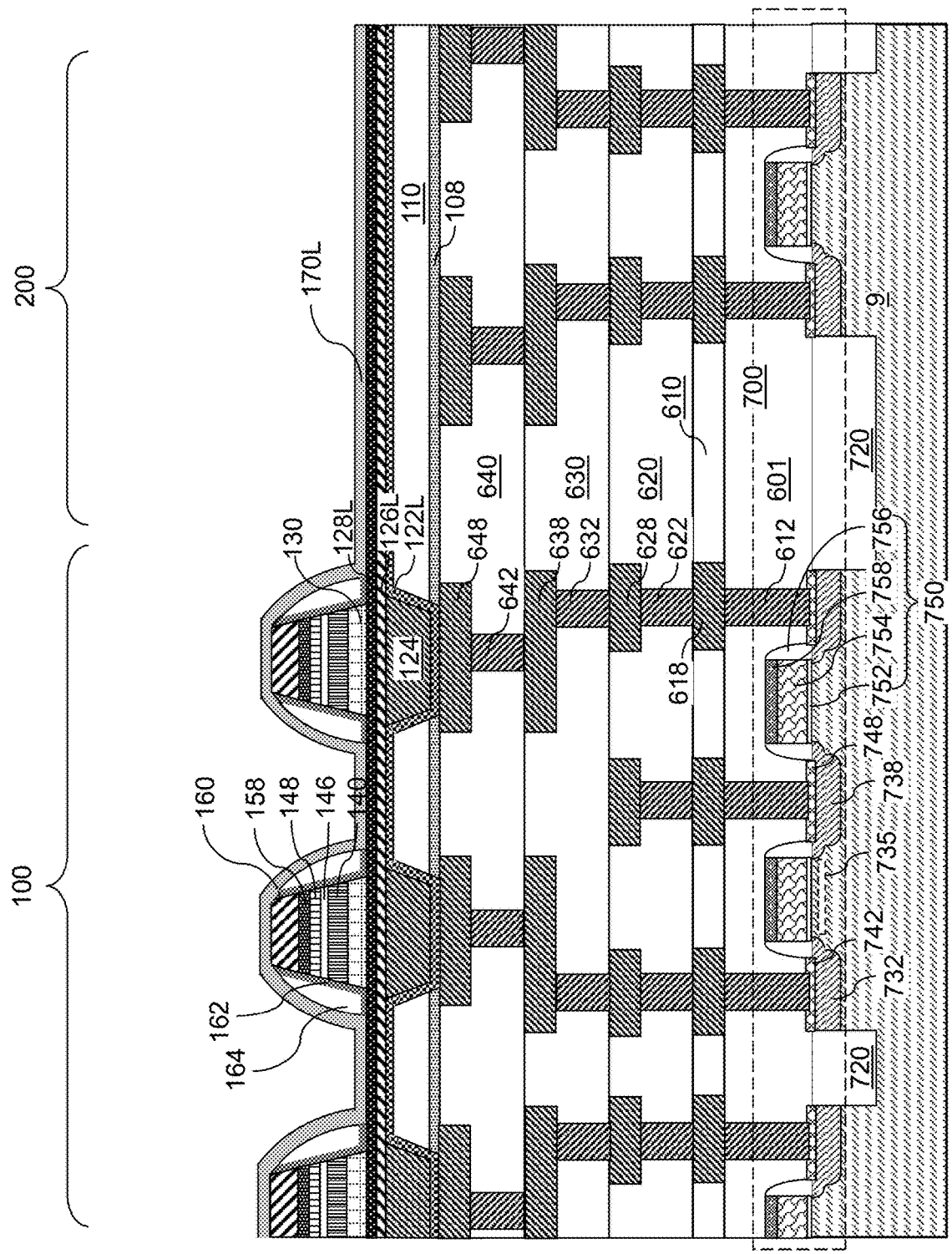
FIG. 9 is a vertical cross-sectional view of the exemplary structure after formation of an etch stop dielectric layer according to an embodiment of the present disclosure.

Referring to FIG. 9, a continuous etch stop layer 170L may be formed over the memory array region 100 and a logic region 200 of the memory device by a deposition process. The etch stop dielectric layer 170L includes a dielectric material can be used as an etch stop material during an anisotropic etch process. The etch stop dielectric layer 170L includes a non-reactive dielectric hard mask material. For example, the continuous etch stop dielectric layer 170L can include, and/or can consist essentially of, $AlO_x$, AlN, $HfO_x$, and/or $ZrO_x$. Other suitable materials within the contemplated scope of disclosure which have high resistance to fluorine (F) based etches may also be used. The etch stop dielectric layer 170 can be deposited by plasma-enhanced chemical vapor deposition (PECVD), high density plasma chemical vapor deposition (HDP-CVD) or atmospheric pressure chemical vapor deposition (APCVD). The etch stop dielectric layer 170 can be deposited conformally or non-conformally.

Figure 10:
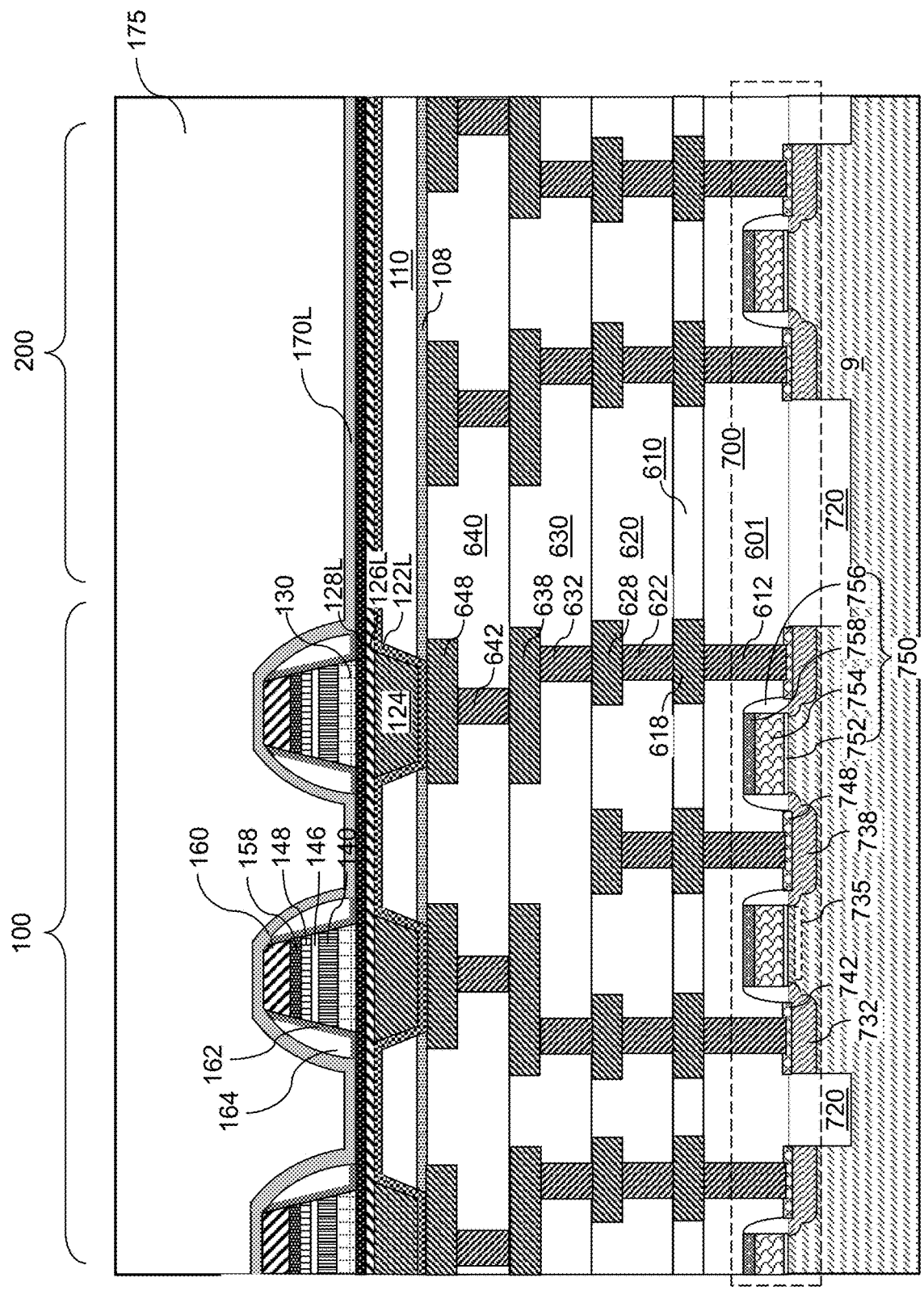
FIG. 10 is a vertical cross-sectional view of the exemplary structure after formation of a mask layer according to an embodiment of the present disclosure.
Figure 11:
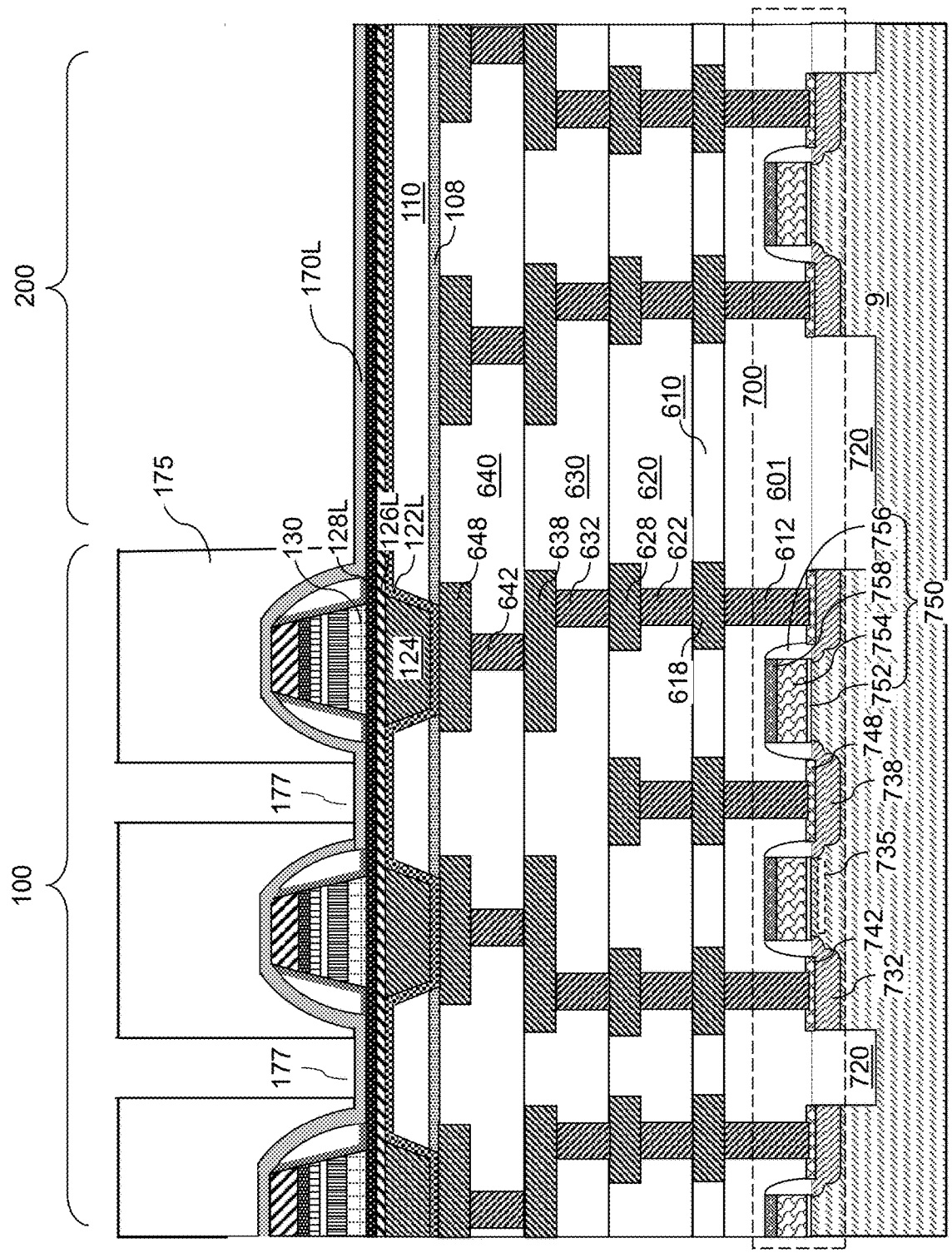
FIG. 11 is a vertical cross-sectional view of the exemplary structure after patterning the mask layer to expose portions of the etch stop dielectric according to an embodiment of the present disclosure.

Referring to FIG. 10, a mask layer 175 may be deposited over the etch stop dielectric layer 170. In an embodiment, the mask layer 175 is a photoresist. Referring to FIG. 11, the mask layer 175 may be patterned to expose portions 177 of the etch stop dielectric layer 170 between the memory cells in the memory array region 100 and to expose the etch stop dielectric layer 170 in the logic region 200. The mask layer 175 may be patterned with an anisotropic etching method, such as reactive ion etching.

Figure 12:
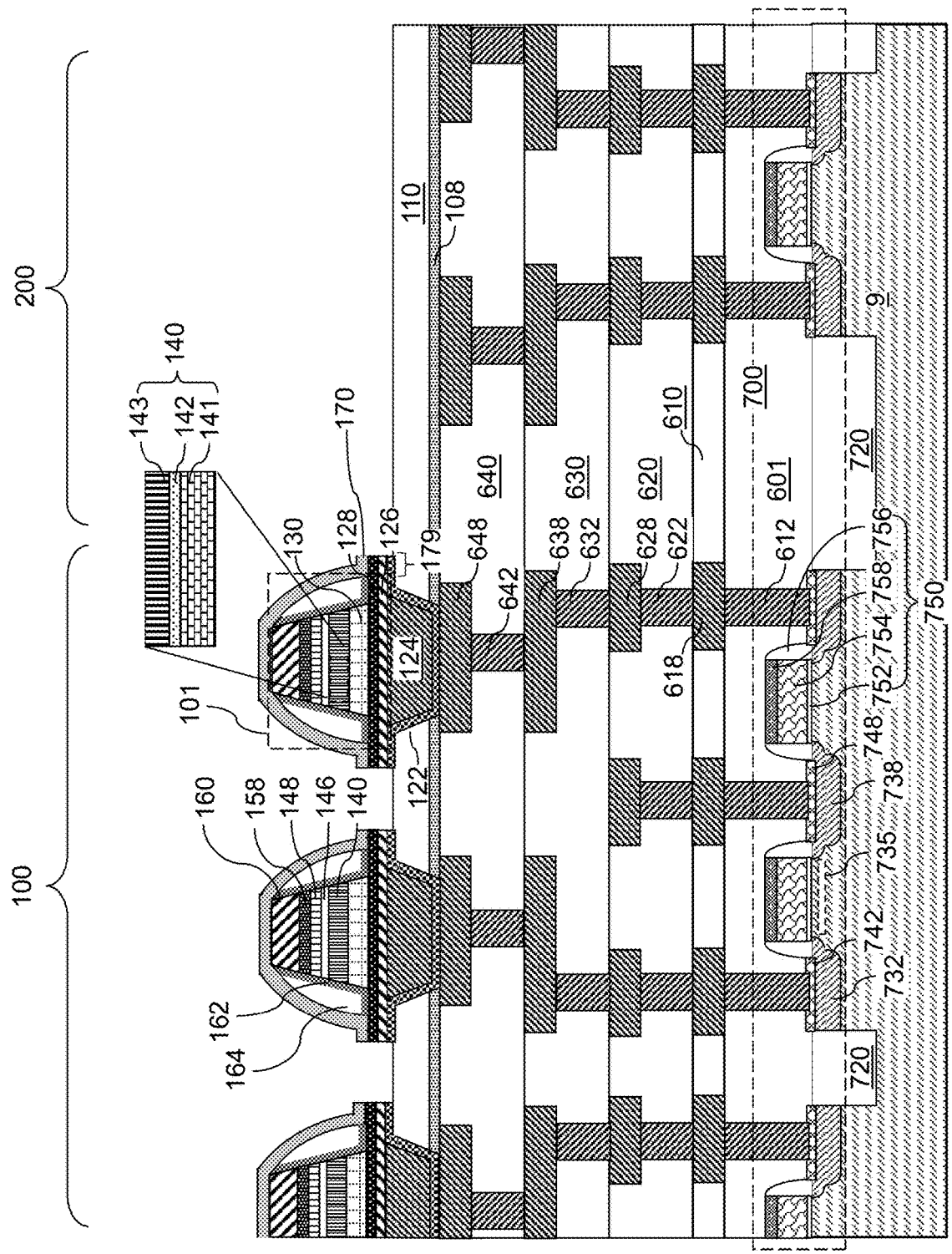
FIG. 12 is a vertical cross-sectional view of the exemplary structure after formation of second bottom electrodes, first bottom electrodes, and bottom electrode connection via structures according to an embodiment of the present disclosure.

Referring to FIG. 12, an etch process can be performed to pattern the continuous second bottom electrode layer 128L, the continuous first bottom electrode material layer 126L, and the continuous metallic barrier layer 122L by performing an anisotropic etch process. In such embodiments, portions of the continuous metallic barrier layer 122L, the continuous first bottom electrode material layer 126L, and the continuous second bottom electrode layer 128L that are not masked can be removed by the etch process. The etch process can be selective to material of the via-level dielectric layer 110. The etch process may include an anisotropic etch process (such as a reactive ion etch process) and/or an isotropic etch process (such as a wet etch process). In this manner, the bottom electrodes 126, 128 may be formed without etching the top electrodes 160. The mask layer 175 and the etch stop dielectric layer 170 protect the top electrode 160 from being thinned in the etching process. As illustrated in FIG. 12, the resulting memory cell 101 has a first portion 126 of the bottom electrode, metallic barrier layer 122, second portion 128 bottom electrode and etch stop dielectric layer 170 which include flat-top portions 179 that extend horizontally beyond an outer periphery of the dielectric sidewall spacers 162, 164. Thus, a first portion 126 of the bottom electrode may be formed with flat top portions 179 of the bottom electrode material 126, metallic barrier layer 122, and the second portion 128 of the bottom electrode. In an embodiment, the flat-top portions 179 may extend 50-150 Å beyond the outer periphery of the dielectric sidewall spacers 162, 164.

Each patterned portion of the continuous second bottom electrode layer 128L constitutes a second portion 128 of the bottom electrode. Each patterned portion of the continuous first bottom electrode material layer 126L constitutes a first portion 126 of the bottom electrode 126. Each patterned portion of the continuous metallic barrier layer 122L constitutes a metallic barrier layer 122. Each vertical stack of a second portion 128 of the bottom electrode, a first portion 126 of the bottom electrode, and a metallic barrier layer 122 can have vertically coincident sidewalls that are located within a same vertical plane. Each continuous combination of a discrete vertical stack (130, 140, 146, 148, 158, 160), a second bottom electrode layer 128 (which is an optional component), and a first bottom electrode 126 constitutes a memory cell 101, which is a magnetoresistive memory cell. Each combination of a metallic barrier layer 122 and a metallic via fill material portion 124 constitutes a bottom electrode connection via structure (122, 124) that provides electrical connection between a respective first portion 126 of the bottom electrode and a respective fourth metal line structure 648.

Generally, an array of bottom electrode connection via structures (122, 124) can be formed on a respective underlying one of the metal interconnect structures. An array of memory cells 101 may be formed on the array of bottom electrode connection via structures (122, 124). The array of memory cells 101 may be formed over the substrate 9 in the memory array region 100. Each of the memory cells 101 may include a bottom electrode and a vertical stack that may include a memory element (such as a magnetic tunnel junction (143, 146, 148) and a top electrode 160. Each magnetic tunnel junction (143, 146, 148) can comprise a vertical stack of a reference magnetization layer 143, a nonmagnetic tunnel barrier layer 146, and a free magnetization layer 148. In one embodiment, each of the memory cells 101 can comprise a selector element 130 disposed on a respective magnetic tunnel junction (143, 146, 148). The selector element 130 may overlie, or underlie, the respective magnetic tunnel junction (143, 146, 148).

In an alternative embodiment, the patterning of the continuous second bottom electrode layer 128L, the continuous first bottom electrode material layer 126L, and the continuous metallic barrier layer 122L may be performed after forming the array of discrete vertical stacks (130, 140, 146, 148, 158, 160) and prior to formation of the array of dielectric sidewall spacers (162, 164). In this case, the dielectric sidewall spacers (162, 164) can be formed on the sidewalls of the second portion 128 of the bottom electrode, the first portion 126 of the bottom electrodes, and the metallic barrier layers 122.

Figure 13:
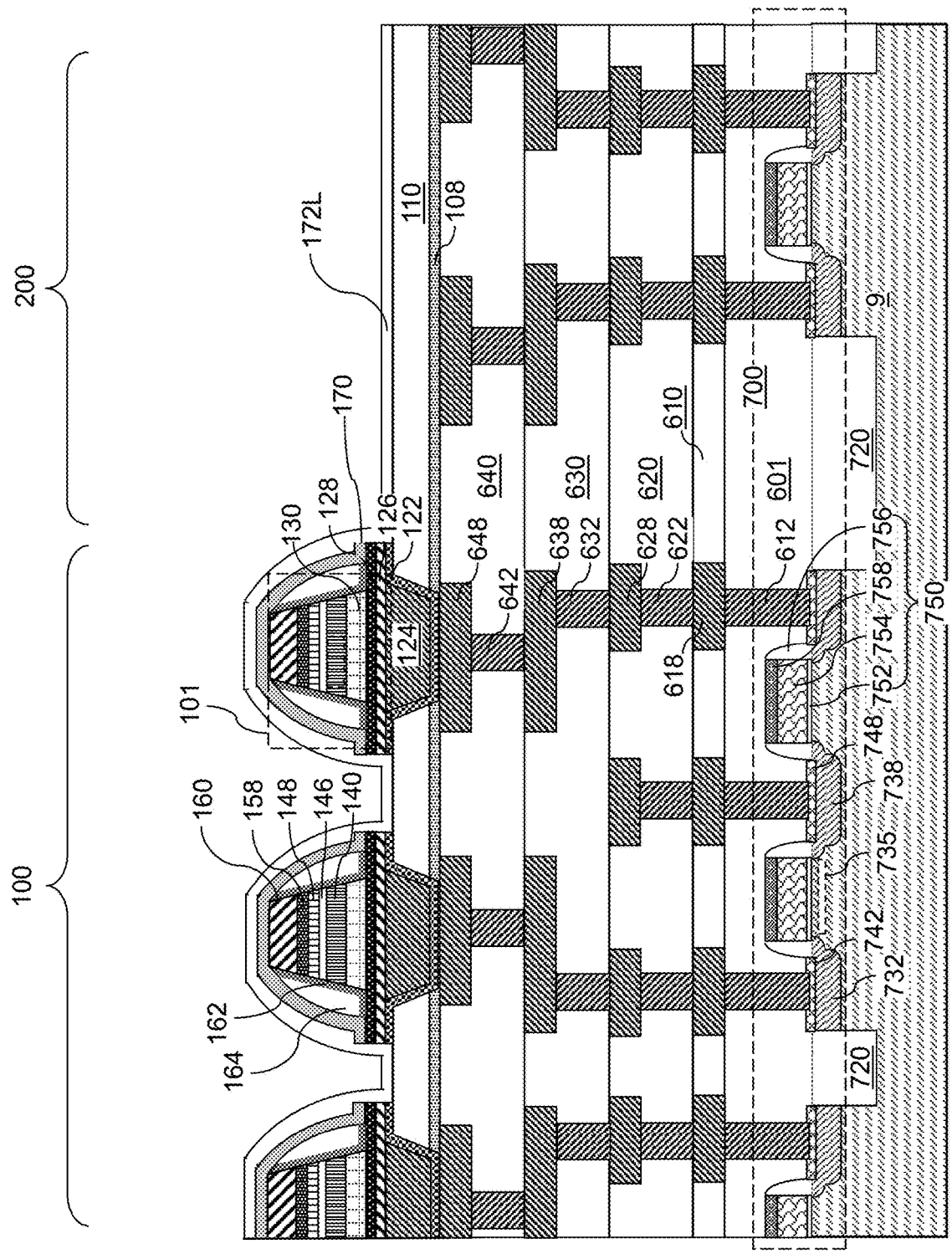
FIG. 13 is a vertical cross-sectional view of the exemplary structure after formation of a silicon oxide liner layer according to an embodiment of the present disclosure.

Referring to FIG. 13, another continuous etch stop dielectric layer 172L can be formed by a deposition process. The continuous etch stop dielectric layer 172L includes a dielectric material that can be used as a planarization stopping material during a chemical mechanical planarization process, and can be subsequently used as an etch stop material during an anisotropic etch process. The continuous etch stop dielectric layer 172L includes a non-reactive dielectric hard mask material. For example, the etch stop dielectric layer 172L can include, and/or can consist essentially of, SiC, SiON, and/or SiN. Other suitable materials within the contemplated scope of disclosure which have high selectivity to $C_xF_y$ may also be used. The second, continuous etch stop dielectric layer 172L can be deposited by plasma-enhanced chemical vapor deposition (PECVD), high density plasma chemical vapor deposition (HDP-CVD) or atmospheric pressure chemical vapor deposition (APCVD). The second, continuous etch stop dielectric layer 172L can be deposited conformally or non-conformally.

The second, continuous etch stop dielectric layer 172L may be formed over, and on, the first etch stop dielectric layer 170, the array of dielectric sidewall spacers (162, 164), and over the array of memory cells 101. The second, continuous etch stop dielectric layer 172L comprises a horizontally-extending portion that continuously extends throughout the memory array region 100 and extends into the logic region 200, and an array of vertically-protruding portions that laterally surround each memory cell 101 in the array of memory cells 101. The thickness of a horizontally-extending portion of the second, continuous etch stop dielectric layer 172L in the logic region 200 or above the top surfaces of the top electrodes 160 can be in a range from 5 nm to 50 nm, although lesser and greater thicknesses can also be used.

Figure 14:
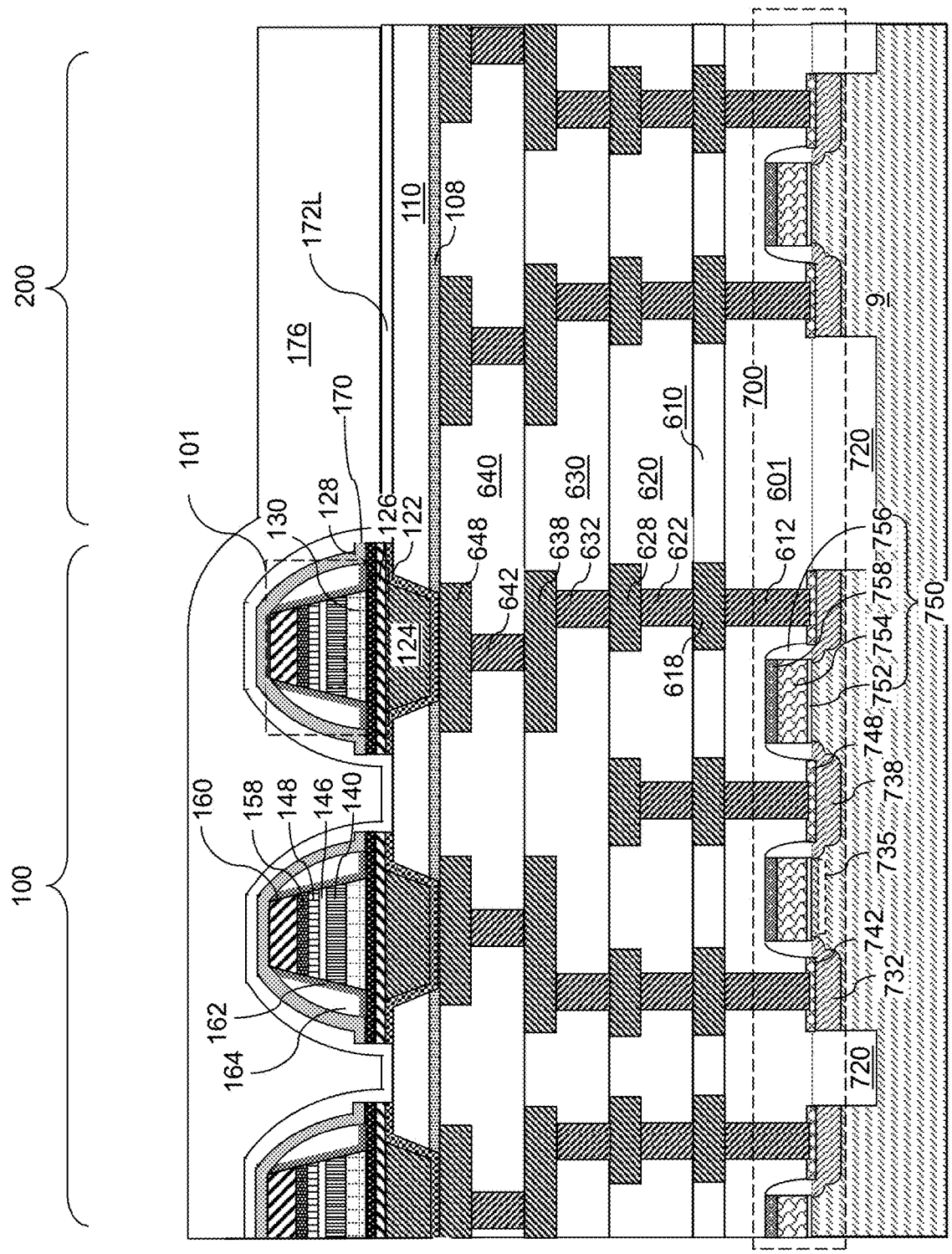
FIG. 14 is a vertical cross-sectional view of the exemplary structure after formation of a first dielectric matrix layer according to an embodiment of the present disclosure.

Referring to FIG. 14, a first dielectric matrix layer 176 can be formed over the second etch stop dielectric layer 172. The first dielectric matrix layer 176 can be formed by a chemical vapor deposition process. In one embodiment, the first dielectric matrix layer 176 includes a low-dielectric-constant (low-k) dielectric material having a dielectric constant less than the dielectric constant of thermal silicon oxide (i.e., 3.9). In one embodiment, the first dielectric matrix layer 176 includes an extremely-low-dielectric-constant (low-k) (ELK) dielectric material having a dielectric constant less than 2.5. In one embodiment, the first dielectric matrix layer 176 includes a porous silicon oxide-based dielectric material having a dielectric constant less than 2.5. In this case, the porous silicon oxide-based dielectric material may include a porogen-doped SiCO-based material having a porous structure. The porous structure can be formed by incorporating a pore generating material (a porogen) into a carbon-doped oxide using a chemical vapor deposition process. The chemical vapor deposition process may include a plasma-enhanced chemical vapor deposition process (PECVD) or a thermal chemical vapor deposition process. The index of refraction of the ELK dielectric material in the first dielectric matrix layer 176 may be in a range from 1.0 to 1.4 at the wavelength of 632.8 nm (which is the wavelength of commercially available HeNe laser measurement instruments).

A first portion of a top surface of the first dielectric matrix layer 176 located in the memory array region 100 may have a greater vertical separation distance from the substrate 9 than a second portion of the top surface of the first dielectric matrix layer 176 formed in the logic region 200. In other words, the top surface of the first dielectric matrix layer 176 may be higher in the memory array region 100 than in the logic region 200. The first portion of the top surface of the first dielectric matrix layer 176 can include the topmost portion of the top surface of the first dielectric matrix layer 176. The height differential between the first portion of a top surface of the first dielectric matrix layer 176 located in the memory array region 100 and the second portion of the top surface of the first dielectric matrix layer 176 formed in the logic region 200 is due to the presence of the array of memory cells 101 and the array of dielectric sidewall spacers (162, 164) in the memory array region 100.

The contour of the top surface of the first dielectric matrix layer 176 initially follows the contour of the physically exposed surfaces of the array of memory cells 101 and the array of dielectric sidewall spacers (162, 164) in the memory array region 100 during deposition of the first dielectric matrix layer 176. Upon merging of material portions of the first dielectric matrix layer 176 midway between each neighboring pair of dielectric sidewall spacers (162, 164), the contour of the top surface of the first dielectric matrix layer 176 gradually flattens, and is raised with continual accumulation of the dielectric material until termination of the deposition process for the first dielectric matrix layer 176. In one embodiment, the duration of the deposition process that deposits the first dielectric matrix layer 176 can be selected such that the top surface of the portion of the first dielectric matrix layer 176 in the logic region 200 is within the same horizontal plane as the top surfaces of the top electrodes 160. In other words, the duration of the deposition process that deposits the first dielectric matrix layer 176 can be selected such that the thickness of the first dielectric matrix layer 176 in the logic region 200 is the same as the distance obtained by adding the height of a memory cell 101 and the thickness of a metallic barrier layer 122, and then subtracting the thickness of the second etch stop dielectric layer 172 in the logic region 200.

The height differential between the first portion of a top surface of the first dielectric matrix layer 176 located in the memory array region 100 and the second portion of the top surface of the first dielectric matrix layer 176 formed in the logic region 200 can be in a range from 40% to 100%, such as from 70% to 90%, of the vertical distance between the horizontal plane including the top surface of the via-level dielectric layer 110 and the horizontal plane including the top surfaces of the top electrodes 160. In one embodiment, the first dielectric matrix layer 176 may have a vertical undulation of the height in the memory array region 100. In one embodiment, the height differential between the first portion of a top surface of the first dielectric matrix layer 176 located in the memory array region 100 and the second portion of the top surface of the first dielectric matrix layer 176 formed in the logic region 200 can be in a range from 40 nm to 400 nm, such as from 80 nm to 200 nm, although lesser and greater height differentials can also be used.

Figure 15:
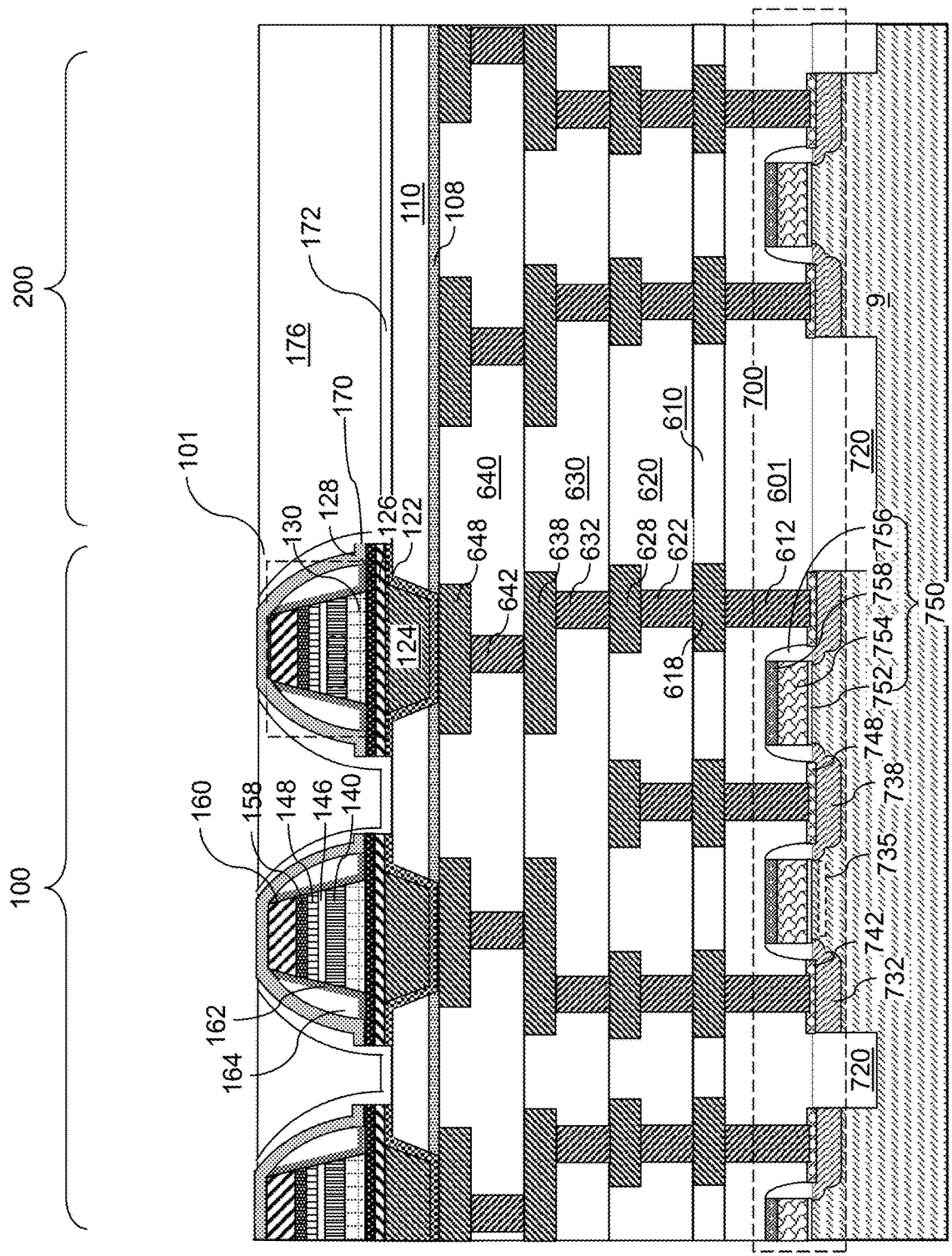
FIG. 15 is a vertical cross-sectional view of the exemplary structure after a chemical mechanical planarization process that uses portions of the etch stop dielectric layer in a memory array region as stopping structures according to an embodiment of the present disclosure.

Referring to FIG. 15, the first dielectric matrix layer 176 can be planarized by performing a chemical mechanical planarization process. Portions of the first dielectric matrix layer 176 that overlie the horizontal plane can be removed from the memory array region 100 by the chemical mechanical planarization process. The top surface of the portion of the first dielectric matrix layer 176 in the logic region 200 can be coplanar with the top surfaces of the top electrodes 160 in the logic region 200.

Figure 16:
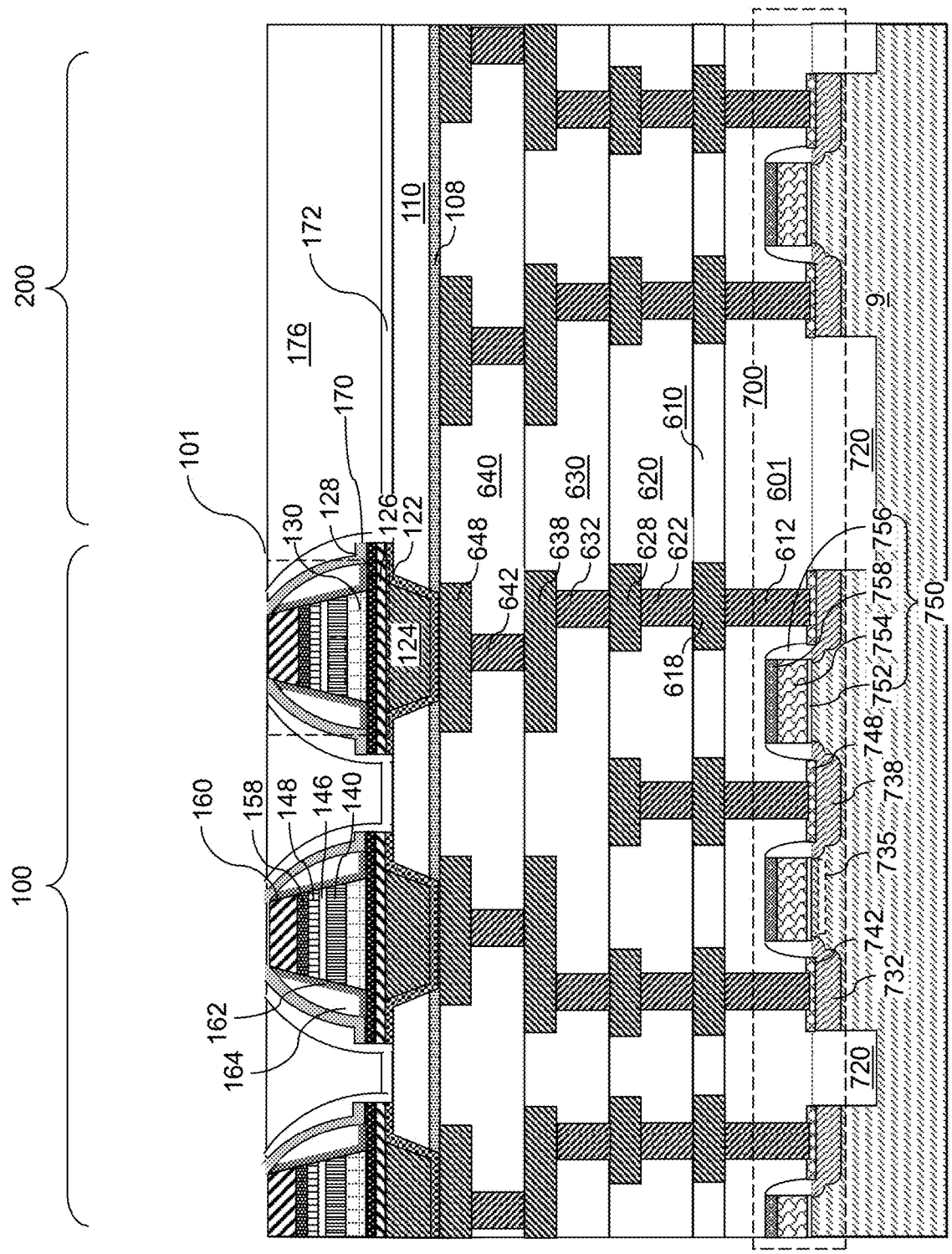
FIG. 16 is a vertical cross-sectional view of the exemplary structure after a touch-up planarization process that removes portions of the etch stop dielectric layer in the memory array region according to an embodiment of the present disclosure.

Referring to FIG. 16, a touch-up planarization process can be performed to remove portions of the etch stop dielectric layer 172 that overlie the top electrodes 160 in the memory array region 100. The touch-up planarization process may use a dry etch process, which may include an anisotropic dry etch process (such as a reactive ion etch process) or an isotropic dry etch process (such as a chemical dry etch process). In this case, the etch chemistry of the dry etch process can be selected to remove the materials of the etch stop dielectric layer 172 selective to the material of first dielectric matrix layer 176, or with the same etch rate as the etch rate for the material of the first dielectric matrix layer 176. Alternatively, the touch-up planarization process may use a touch-up chemical mechanical planarization process. In this case, the chemical mechanical planarization process that removes portions of the first dielectric matrix layer 176 in the memory array region 100 may be continued until the portions of the etch stop dielectric layer 172 that overlie the top electrodes 160 in the memory array region 100 are removed.

Optionally, portions of the first dielectric matrix layer 176 located above the horizontal plane including the top surfaces of the top electrodes 160 can be collaterally removed during the touch-up planarization process. Generally, top surfaces of the top electrodes 160 can be physically exposed during, or after, the chemical mechanical planarization process that planarizes the first dielectric matrix layer 176.

Figure 17:
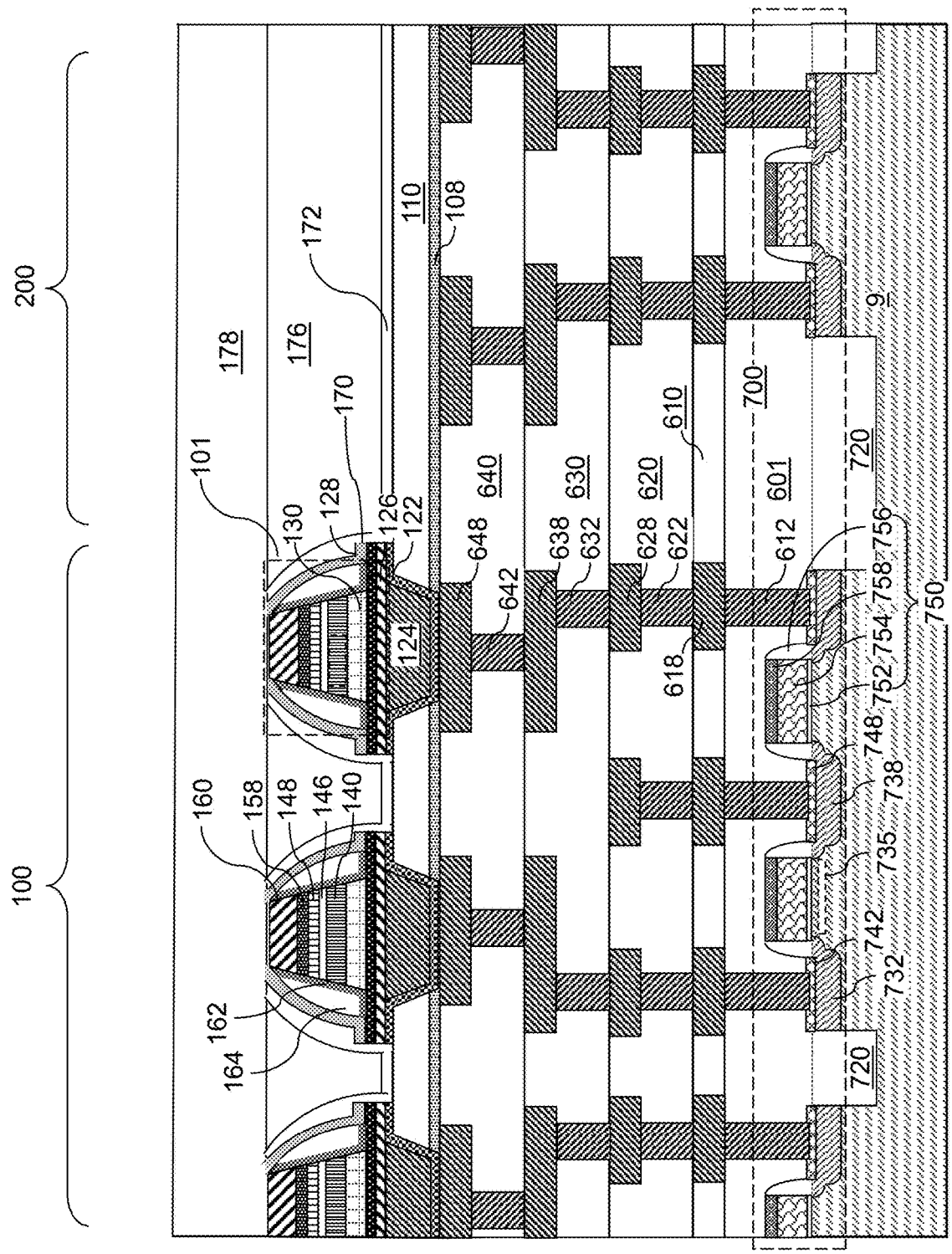
FIG. 17 is a vertical cross-sectional view of the exemplary structure after formation of a second dielectric matrix layer according to an embodiment of the present disclosure.

Referring to FIG. 17, a second dielectric matrix layer 178 can be deposited over, and directly on, the physically exposed horizontal surface of the remaining portion of the first dielectric matrix layer 176. The second dielectric matrix layer 178 may have the same material composition as, or may have a material composition that is different from, the material composition of the first dielectric matrix layer 176. In one embodiment, the second dielectric matrix layer 178 can include a low-dielectric-constant (low-k) dielectric material, such as an ELK dielectric material having a dielectric constant less than 2.5. In one embodiment, the second dielectric matrix layer 178 includes a porous silicon oxide-based dielectric material having a dielectric constant less than 2.5. The thickness of the second dielectric matrix layer 178 can be the same as the target height of metallic cell contact structures to be formed on the top surfaces of the top electrodes 160. For example, the second dielectric matrix layer 178 can have a thickness in a range from 20 nm to 160 nm, such as from 40 nm to 80 nm, although lesser and greater thicknesses can also be used. In one embodiment, the entire top surface of the second dielectric matrix layer 178 can be located within a first horizontal plane, and the entire bottom surface of the second dielectric matrix layer 178 can be located within a second horizontal plane. Thus, the entirety of the second dielectric matrix layer 178 can have a uniform thickness throughout.

Figure 18:
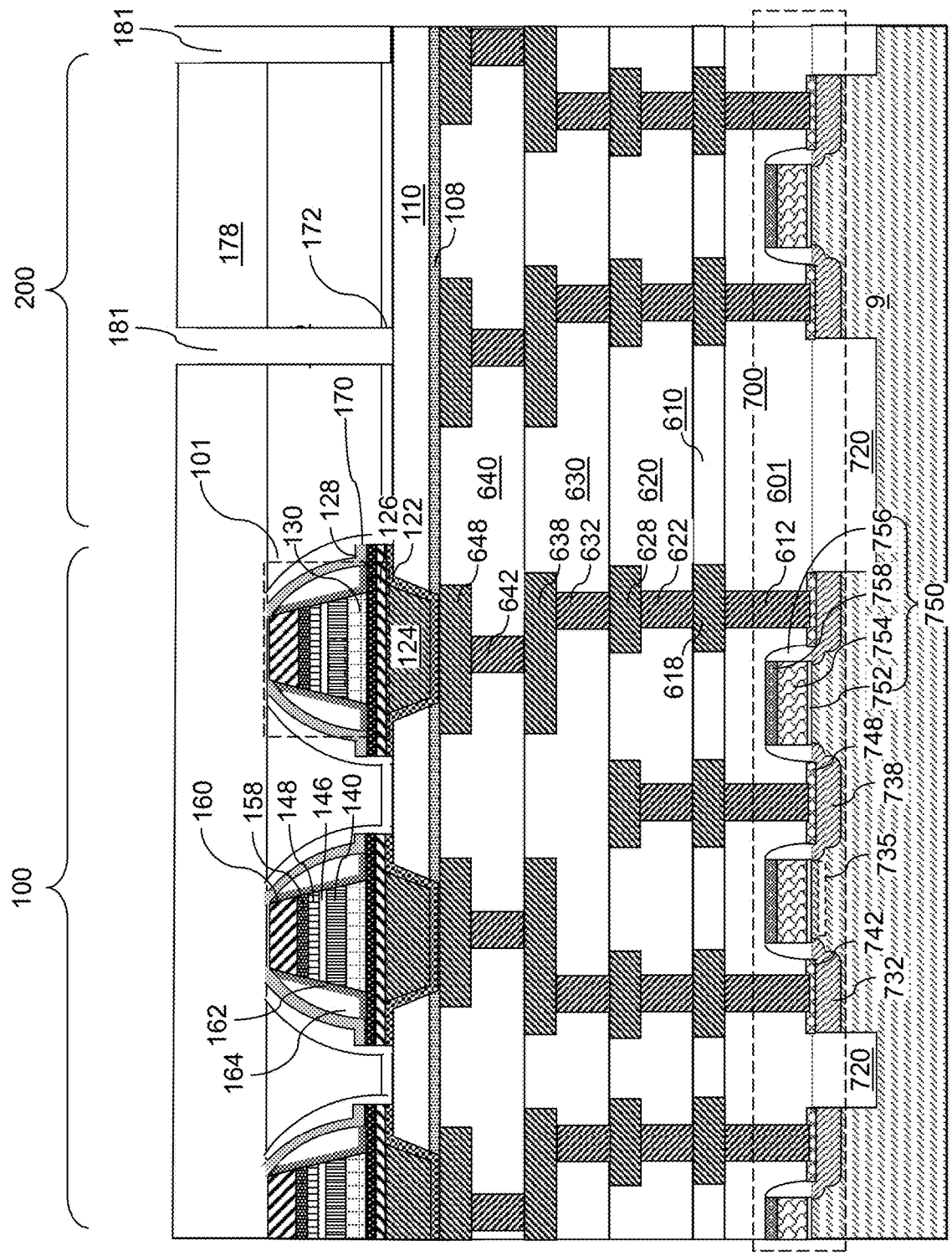
FIG. 18 is a vertical cross-sectional view of the exemplary structure after formation of via cavities in the logic region according to an embodiment of the present disclosure.

Referring to FIG. 18, a first photoresist layer (not shown) can be applied over the second dielectric matrix layer 178, and can be lithographically patterned to form an array of openings in the logic region 200. The pattern of the openings in the photoresist layer can be transferred through the second dielectric matrix layer 178, the first dielectric matrix layer 176 and the second etch stop dielectric layer 172. In one embodiment, the second etch stop dielectric layer 172 can be used as an etch stop layer for a first etch step that etches the materials of the second dielectric matrix layer 178, the first dielectric matrix layer 176, and an etch chemistry that etches the material of the second etch stop dielectric layer 172 may be used during a second etch step of the anisotropic etch process. Via cavities 181 are formed underneath each opening in the photoresist layer. A top surface of the via-level dielectric layer 110 can be physically exposed at the bottom of each via cavity 181. The first photoresist layer can be subsequently removed, for example, by ashing.

Figure 19:
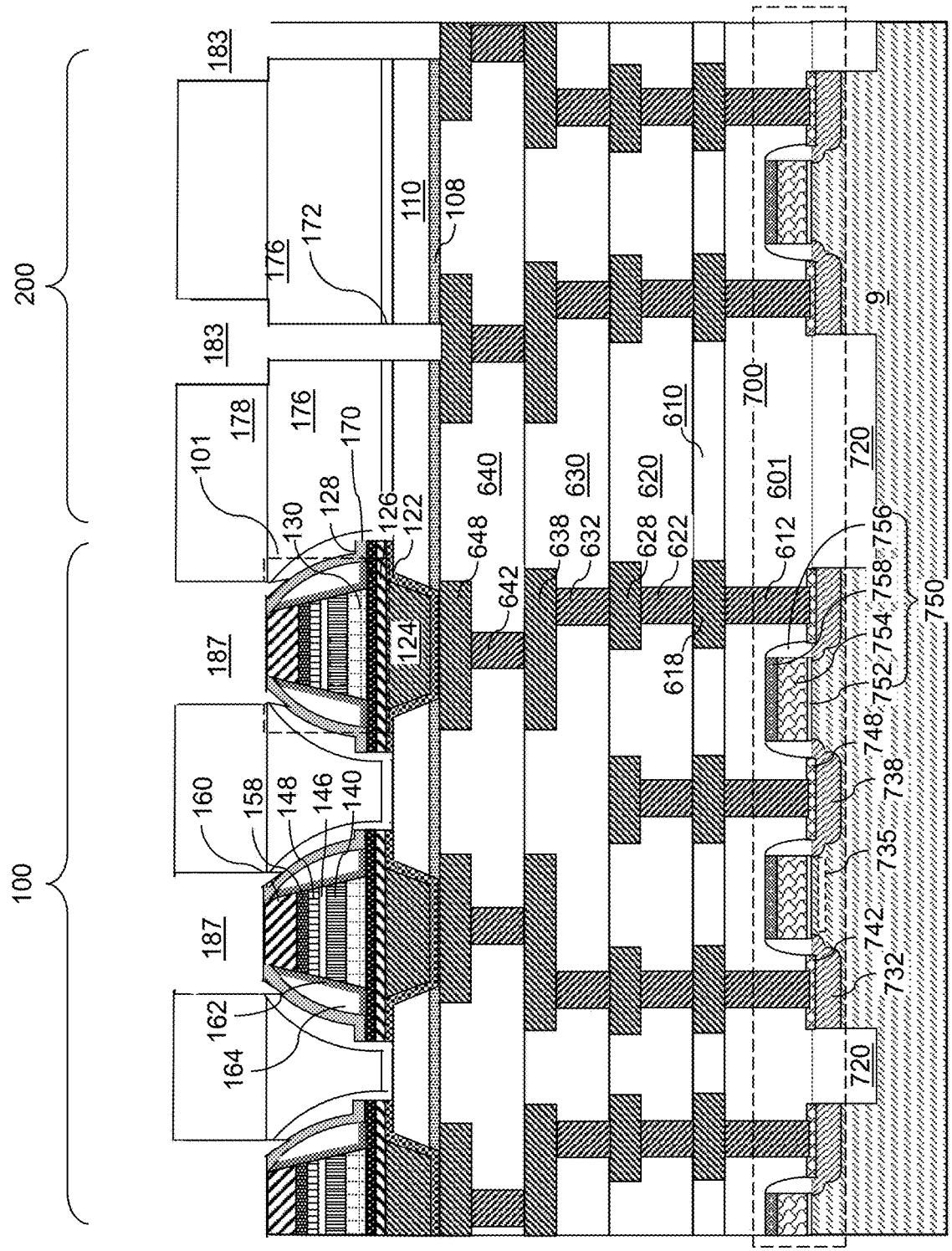
FIG. 19 is a vertical cross-sectional view of the exemplary structure after formation of integrated line and via cavities in the logic region and cell contact cavities in the memory array region according to an embodiment of the present disclosure.

Referring to FIG. 19, a second photoresist layer can be applied over the second dielectric matrix layer 178, and can be lithographically patterned to form line patterns. The areas of the line pattern in the photoresist layer can include all areas of the via cavities 181. Thus, the second photoresist layer can be removed from inside the via cavities 181 upon development of the second photoresist layer. An anisotropic etch process can be performed to transfer the line patterns in the second photoresist layer into underlying material portions. Each via cavity 181 is vertically extended through the via-level dielectric layer 110 and through the dielectric cap layer 108 so that a top surface of a respective fourth metal line structures 648 may be physically exposed underneath each via cavity 181. Further, portions of the second dielectric matrix layer 178 that are not masked by the patterned second photoresist layer may be etched through to form line cavities. Integrated line and via cavities 183 are formed in the logic region 200. Each integrated line and via cavity 183 may include a respective line cavity and at least one via cavity adjoined to a bottom surface of the respective line cavity. Cell contact cavities 187 overlying a respective one of the top electrodes 160 are formed in the memory array region 100.

According to an aspect of the present disclosure, the anisotropic etch process that forms the cell contact cavities 187 and the integrated line and via cavities 183 can be selective to the material of the etch stop dielectric layer 172. The cell contact cavities 187 may be formed through the second dielectric matrix layer 178 by performing the anisotropic etch process, which etches the material of the second dielectric matrix layer 178 selective to the material of the etch stop dielectric layer 172. In one embodiment, the lateral extent of a cell contact cavity 187 (which is herein referred to as a first cell contact cavity) selected from the array of cell contact cavities 187 can be greater than the lateral extent of a respective underlying top electrode 160, i.e., greater than the lateral extent of the top electrode that underlies the first cell contact cavity. In one embodiment a plurality of cell contact cavities 187 can have a respective lateral extent that is greater than the lateral extent of a respective underlying top electrode 160. In one embodiment, each of the cell contact cavities 187 can have a respective lateral extent that is greater than the lateral extent of a respective underlying top electrode 160. In this case, each cell contact cavity 187 (such as the first cell contact cavity) having a greater lateral extent than the lateral extent of a respective underlying top electrode 160, can extend into an upper portion of the first dielectric matrix layer 176, and thus, can include a downward-protruding portion that extends below the horizontal plane including the top surfaces of the top electrodes 160 and overlying a tapered portion of the second etch stop dielectric layer 172.

In one embodiment, the bottom surfaces of the line trenches within the integrated line and via cavities 183 can be formed below the horizontal interface between the first dielectric matrix layer 176 and the second dielectric matrix layer 178. Vertically-protruding portions of the etch stop dielectric layer 172 that laterally surround the memory cells 101 function as etch stop material portions while the bottom surfaces of the line trenches are vertically recessed below the horizontal interface between the first dielectric matrix layer 176 and the second dielectric matrix layer 178. Thus, the cell contact cavities 187 do not extend through the etch stop dielectric layer 172, and do not contact any of the underlying dielectric sidewall spacers (162, 164). Accordingly, sidewalls of the various layers within each memory cell 101 remain covered with a respective one of the dielectric sidewall spacers (162, 164).

Figure 20:
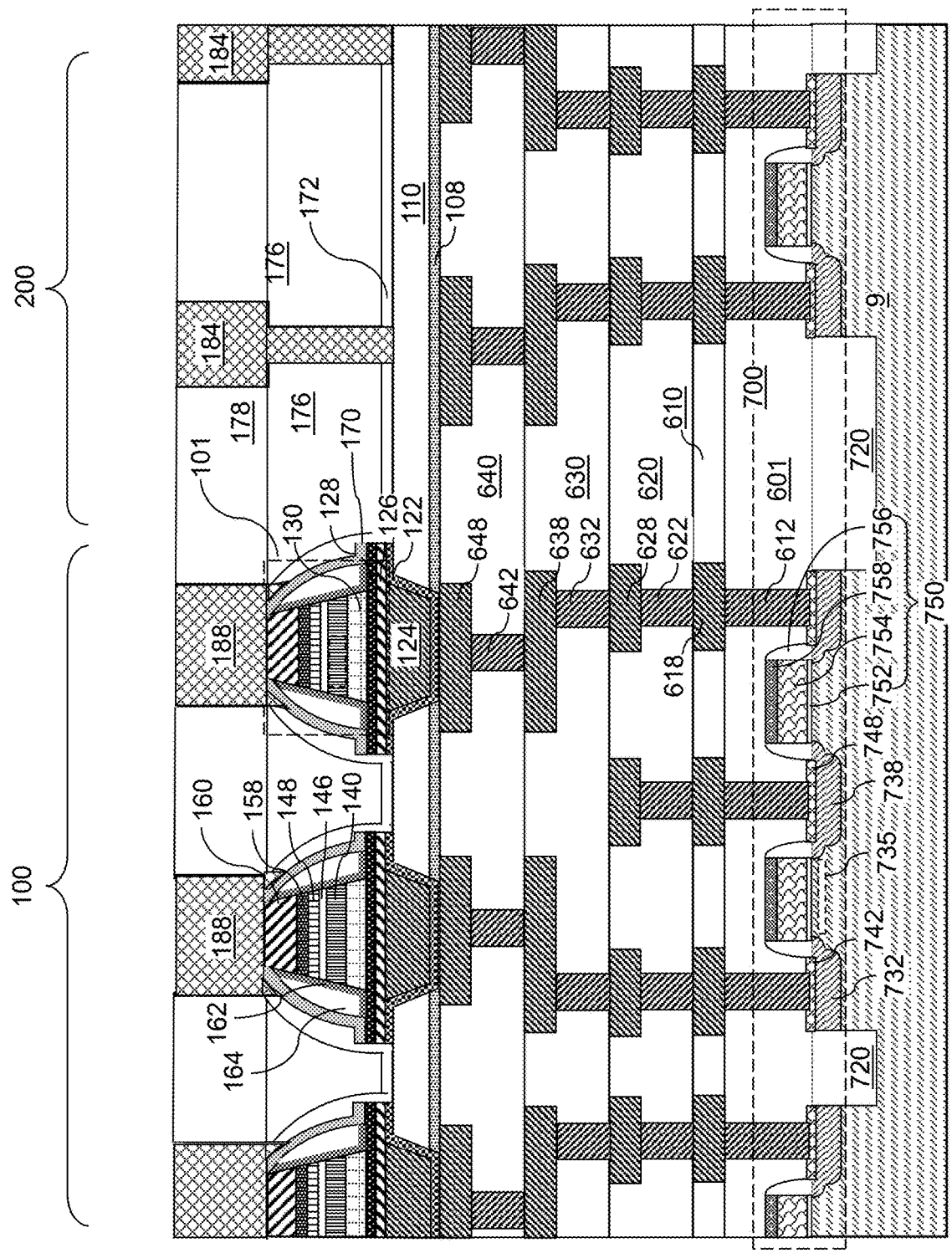
FIG. 20 is a vertical cross-sectional view of the exemplary structure after formation of integrated line and via structures in the logic region and metallic cell contact structures in the memory array region according to an embodiment of the present disclosure.

Referring to FIG. 20, at least one conductive material can be deposited in the line and via cavities 183 and in the cell contact cavities 187. The at least one conductive material can include, for example, a metallic liner material such as TiN, TaN, or WN, and a metallic fill material such as W, Cu, Co, Ru, Mo, Al, alloys thereof, and/or a layer stack thereof. Other suitable materials within the contemplated scope of disclosure may also be used. Excess portions of the at least one conductive material overlying the horizontal plane including the top surface of the second dielectric matrix layer 178 can be removed by a planarization process such as a chemical mechanical polish process. Each remaining portion of the at least one conductive material that fills an integrated line and via cavity 183 constitutes an integrated line and via structure 184. Each remaining portion of the at least one conductive material that fills a cell contact cavity 187 constitutes metallic cell contact structure 188. The integrated line and via structure 184, the metallic cell contact structure 188, and the bottom electrode connection via structure (122, 124) collectively constitute memory-cell-level metal interconnect structures (122, 124, 184, 188), i.e., metal interconnect structures that are located in the memory cell level that occupies the volume between the horizontal plane including the top surfaces of the fourth metal line structures 648 and the horizontal plane including the top surfaces of the integrated line and via structure 184 and the metallic cell contact structure 188.

Figure 21:
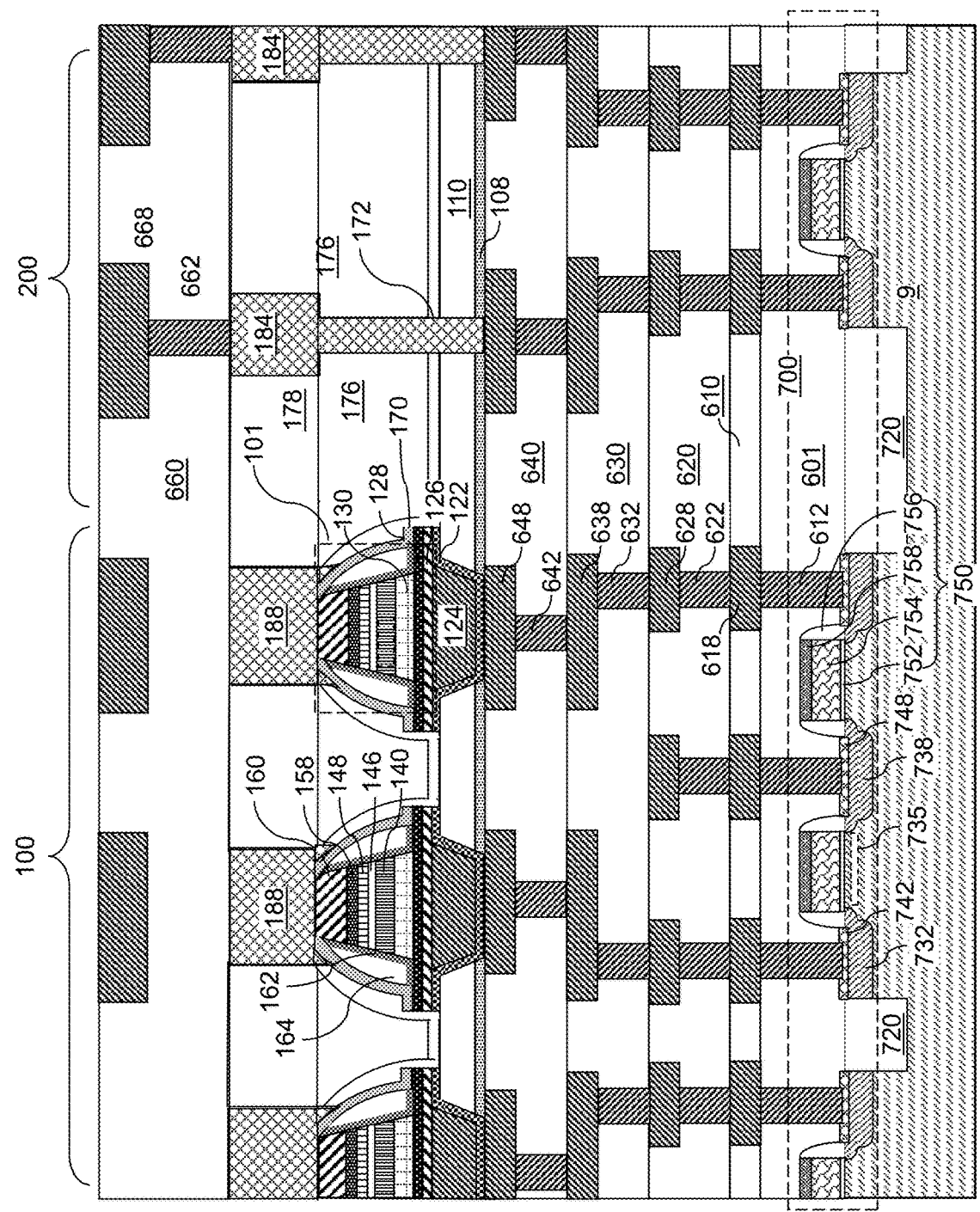
FIG. 21 is a vertical cross-sectional view of the exemplary structure after formation of additional metal interconnect structures formed in additional dielectric material layers according to an embodiment of the present disclosure.

Referring to FIG. 21, additional dielectric material layers and additional metal interconnect structures can be subsequently formed as needed. The combination of the dielectric cap layer 108, the via-level dielectric layer 110, the etch stop dielectric layer 172, the first dielectric matrix layer 176, and the second dielectric matrix layer 178 collectively function as a fifth line-and-via-level dielectric material layer. A sixth line-and-via-level dielectric material layer 660 can be formed over the second dielectric matrix layer 178. Fifth metal via structures 662 can be formed in a lower portion of the sixth line-and-via-level dielectric material layer 660, and sixth metal line structures 668 formed in an upper portion of the sixth line-and-via-level dielectric material layer 640. Bonding pads (not shown) can be formed over the additional metal interconnect structures.

Figure 22:
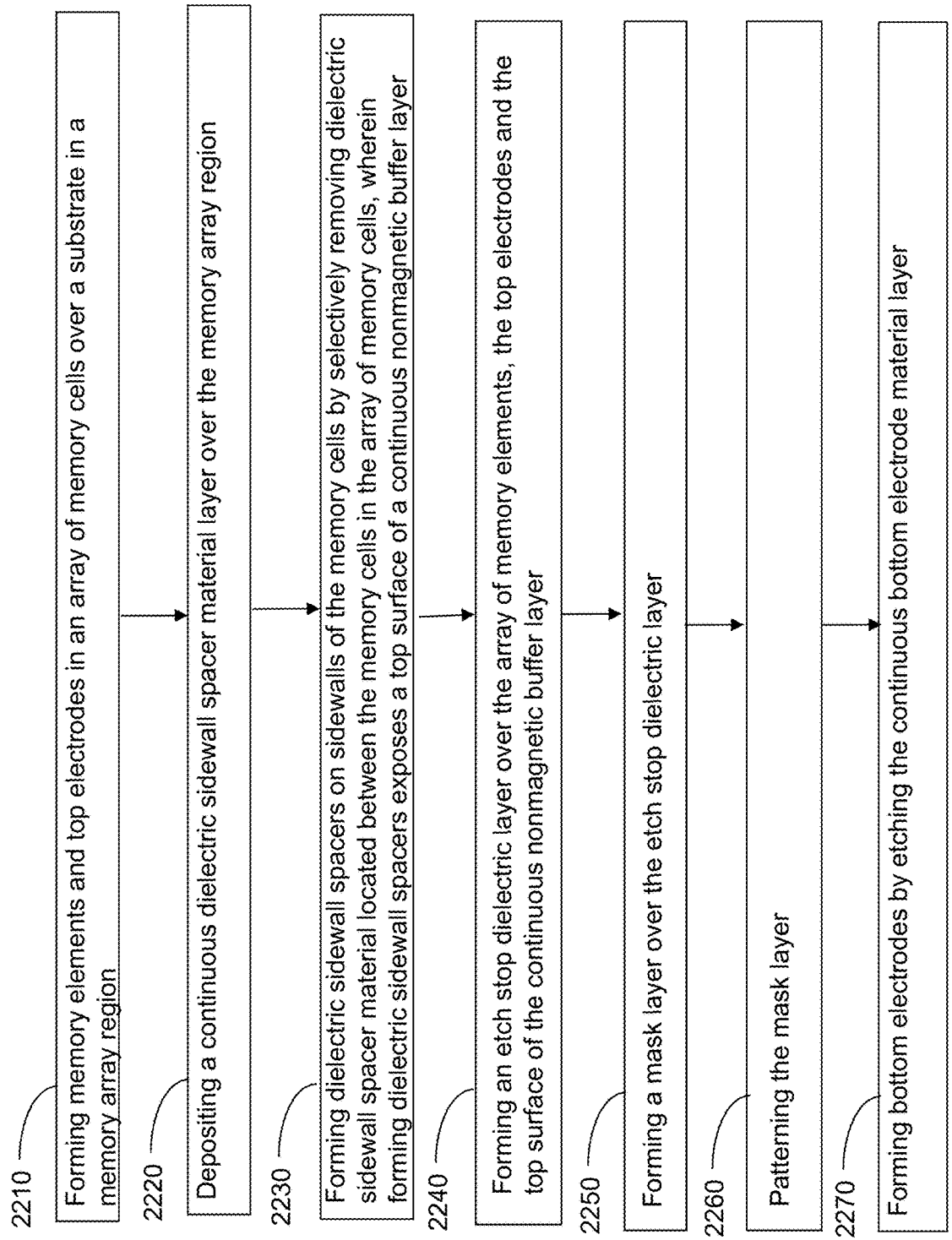
FIG. 22 is a flowchart that illustrates the general processing steps of the methods of the present disclosure.

Referring to FIG. 22, a general method of forming a memory device is provided according to an embodiment of the present disclosure. Referring to step 2210, an array of memory elements and top electrodes 160 can be formed over a substrate 9 in a memory array region 100. The memory element may be a magnetic tunnel junction (143, 146, 148). Referring to step 2220, at least one continuous dielectric sidewall spacer material layer 162L, 164L may be conformally deposited over the memory array region 100. Referring to step 2230, dielectric sidewall spacers 162, 164 may be formed around the periphery of the memory elements by removing portions of the continuous dielectric sidewall spacer material layer 162L, 164L located between the memory elements in an etch process. The continuous dielectric sidewall spacer material layer 162L, 164L may be removed without etching the continuous first bottom electrode material layer 126L, the continuous second bottom electrode layer 128L and the top electrodes 160. Referring to step 2240, an etch stop dielectric layer 170L may be formed over the array of memory elements and top electrodes 160 and the portions of the continuous bottom electrode layer 128L exposed after removing the portions of the continuous dielectric spacer material layer 162L, 164L. Referring to step 2250, a mask layer 175 may be formed over the etch stop dielectric layer 170L. The mask layer 175 may be, for example, a photoresist layer. Referring to step 2260, the mask layer 175 may be patterned to expose portions of the etch stop layer 170L located between memory elements in the array of memory elements. The mask layer 175 may be anisotopically etched. Referring to step 2270, the exposed portions of the etch stop layer 170L, and the underlying continuous second bottom electrode layer 128L, continuous first bottom electrode material layer 126L, and continuous metallic barrier layer 122L may be etched to form discrete bottom electrodes 126 for each respective memory cell 101. The resulting discrete bottom electrodes 126 may be formed with a flat-top portion 179. In an embodiment, the exposed portions of the etch stop layer 170L, and the underlying continuous second bottom electrode layer 128L, continuous first bottom electrode material layer 126L, and continuous metallic barrier layer 122L may be etched in the same step. In an alternative embodiment, the exposed portions of the etch stop layer 170L may be anisotropically etched in a first etch step, and the underlying continuous second bottom electrode layer 128L, continuous first bottom electrode material layer 126L, and continuous metallic barrier layer 122L may be anisotropically etched in a second etch step.

An embodiment includes a memory device including an array of memory cells 101 overlying a substrate 9 and located in a memory array region 100. Each of the memory cells 101 includes a bottom electrode, a vertical stack containing a memory element and a top electrode 160, and dielectric sidewall spacers 162, 164 located on sidewalls of each vertical stack. The bottom electrode 126 includes a flat-top portion 179 that extends horizontally beyond an outer periphery of the dielectric sidewall spacers 162, 164. The memory device also includes an etch stop electric layer 170 over each of the memory cells 101 comprising a horizontally-extending portion that extends over the flat-top portion 179 of the bottom electrode 126 and metallic cell contact structures 188 contacting a respective subset of the top electrodes 160 and a respective subset of vertically-protruding portions of the etch stop dielectric layer 170.

Another embodiment includes a memory device, including an array of memory cells 101 overlying a substrate 9 and located in a memory array region 100. Each of the memory cells includes a bottom electrode, a vertical stack containing a memory element containing a magnetic tunnel junction (143, 146, 148), and a top electrode 160, and dielectric sidewall spacers 162, 164 located on sidewalls of each vertical stack. The bottom electrode 126 comprises a flat-top portion 179 which extends beyond an outer periphery of the dielectric sidewall spacers 162, 164. The memory device also includes an etch stop dielectric 170 over each of the memory cells comprising a horizontally-extending portion that extends over the flat-top portion 179 of the bottom electrode 126 and metallic cell contact structures 188 contacting a respective subset of the top electrodes 160 and a respective subset of the vertically-protruding portions of the etch stop dielectric layer 170.

Another embodiment includes a method of making a memory device including forming an array of memory elements (140, 146, 148) and top electrodes 160 in a stack over a substrate in a memory array region 100, depositing a continuous dielectric sidewall spacer material layer 162L, 164L over the memory array region 100 and forming dielectric sidewall spacers 162, 164 on sidewalls of the memory elements (143, 146, 148) by selectively removing dielectric sidewall spacer material 162L, 164L located between the memory elements (143, 146, 148) in the array of memory elements (143, 146, 148), wherein forming dielectric sidewall spacers 162, 164 exposes a top surface of a continuous second bottom electrode layer 128L. The method also includes forming an etch stop dielectric layer 170L over the array of memory elements (143, 146, 148), the top electrodes 160 and the top surface of the continuous second bottom electrode layer 128L, forming a mask layer 175 over the etch stop dielectric layer 170L, patterning the mask layer 175 and forming bottom electrodes 126, 128 by etching the continuous second bottom electrode layer 128L, the continuous first bottom electrode material layer 126L, and the continuous metallic barrier layer 122L, wherein the bottom electrodes 126 comprise a flat-top portion 179 that extends horizontally beyond an outer periphery of the dielectric sidewall spacers 162, 164.

Referring to all drawings and according to various embodiments of the present disclosure, a memory device and methods of making the memory device in which the thickness of a top electrode 160 is substantially preserved (i.e., not thinned) during further fabrication of the memory device is provided. Specifically, the dielectric sidewall spacers 162, 164 may be formed on the sidewalls of the memory elements (143, 146, 148) by selectively etching the continuous dielectric spacer material layer 162L, 164L. The selective etch exposes the top surface of the top electrodes 160 but causes little or no thinning of the thickness of the top electrodes 160. To further protect the thickness of the top electrodes 160, an etch stop dielectric layer 170L and a mask layer 175 may be formed over the array of memory elements (143, 146, 148) and the top electrodes 160 prior to etching the bottom electrode material layer 126L to form the bottom electrodes 126. In this manner, the bottom electrodes 126 may be formed while the top electrodes 160 may be protected by the etch stop dielectric layer 170L and the mask layer 175. A resulting flat-top portion 179 of the bottom electrode 126 that extends horizontally beyond an outer periphery of the dielectric sidewall spacers 162, 164 may be formed as a result of the processing operations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
an array of memory cells overlying a substrate and located in a memory array region, each of the memory cells including a bottom electrode, a vertical stack comprising a memory element and a top electrode, and dielectric sidewall spacers located on sidewalls of the vertical stack, wherein the bottom electrode comprises a flat-top portion that extends horizontally beyond an outer periphery of the dielectric sidewall spacers;
an etch stop dielectric layer over each of the memory cells comprising a horizontally-extending portion that extends over the flat-top portion of the bottom electrode; and
metallic cell contact structures contacting a respective subset of the top electrodes and a respective subset of vertically-protruding portions of the etch stop dielectric layer.

2. The memory device of claim 1, wherein a thickness of the top electrode in a finished device is the substantially same thickness as a top electrode layer deposited during fabrication of the memory device.

3. The memory device of claim 1, wherein the etch stop dielectric layer comprises a vertically-protruding portion that laterally surround each memory cell in the array of memory cells, wherein the vertically-protruding portion includes an opening at a topmost region and an annular topmost surface that is located within a horizontal plane including a top surface of the top electrode.

4. The memory device of claim 1, further comprising a dielectric layer over the etch stop layer, the dielectric layer extending continuously throughout the memory array region and a logic region.

5. The memory device of claim 4, further comprising memory cell level interconnect structures located in the logic region.

6. The memory device of claim 1, wherein the etch stop layer consists essentially of aluminum oxide ($AlO_x$), silicon nitride ($Si_3N_4$), silicon oxynitride (SiON), silicon carbide (SiC), silicon carbide nitride (SiCN), silicon oxycarbide (SiOC), or a nitrogen-free antireflection layer (NFARL).

7. A memory device, comprising:
an array of memory cells overlying a substrate and located in a memory array region, each of the memory cells including a bottom electrode, a vertical stack comprising a memory element including a magnetic tunnel junction, and a top electrode, and dielectric sidewall spacers located on sidewalls of the vertical stack, wherein the bottom electrode comprises a flat-top portion which extends beyond an outer periphery of the dielectric sidewall spacers;
an etch stop dielectric layer over each of the memory cells comprising a horizontally-extending portion that extends over the flat-top portion of the bottom electrode; and
metallic cell contact structures contacting a respective subset of the top electrodes and a respective subset of vertically-protruding portions of the etch stop dielectric layer.

8. The memory device of claim 7, wherein the magnetic tunnel junction comprises a reference magnetization layer, a nonmagnetic tunnel barrier layer and a free magnetization layer.

9. The memory device of claim 8, wherein the memory element further comprises a selector material, a ferromagnetic hard layer and an antiferromagnetic capping layer.

10. The memory device of claim 7, further comprising metal interconnect structures formed in dielectric material layers and located between the substrate and a bottom electrode connection electrically connected to the bottom electrode.

11. The memory device of claim 7, wherein the bottom electrode comprises a first portion comprising a first material and a second portion comprising a second material.

12. A memory device, comprising:
a memory cell comprising:
a bottom electrode;
a memory element on the bottom electrode;
a top electrode on the memory element; and
a sidewall spacer located on a sidewall of the memory element and top electrode, and contacting an upper surface of the bottom electrode; and
an etch stop layer on the memory cell and contacting the upper surface of the bottom electrode,
wherein the bottom electrode comprises a peripheral portion that extends beyond the sidewall spacer, and the etch stop layer contacts the upper surface of the bottom electrode at the peripheral portion of the bottom electrode.

13. The memory device of claim 12, further comprising:
a metal contact contacting the top electrode through the etch stop layer.

14. The memory device of claim 12, wherein a length of the peripheral portion of the bottom electrode is in a range from 50 Å to 150 Å.

15. The memory device of claim 12, wherein the etch stop layer comprises a sidewall that is aligned with a sidewall of the peripheral portion of the bottom electrode.

16. The memory device of claim 15, further comprising:
a connection via structure, the bottom electrode being located on the connection via structure and a sidewall of the connection via structure being aligned with the sidewall of the peripheral portion of the bottom electrode.

17. The memory device of claim 16, wherein the connection via structure comprises:

a metallic barrier layer; and a metallic via fill material portion formed on the metallic barrier layer, wherein the bottom electrode contacts an upper surface of the metallic barrier layer and an upper surface of the metallic via fill material portion.

18. The memory device of claim 12, wherein the memory element comprises a magnetic tunnel junction comprising:

a reference magnetization layer;

a nonmagnetic tunnel barrier layer on the reference magnetization layer; and a free magnetization layer on the nonmagnetic tunnel barrier layer.

19. The memory device of claim 12, wherein the memory cell is located in a memory array region of the memory device.

20. The memory device of claim 12, wherein the sidewall spacer comprises:

a nitride layer that contacts the sidewall of the memory element and top electrode; and an oxide layer on the nitride layer and separated from the vertical stack and bottom electrode by the nitride layer.

* * * * *